(12) United States Patent
Yun et al.

(10) Patent No.: US 11,387,395 B2
(45) Date of Patent: Jul. 12, 2022

(54) LIGHTING MODULE AND LIGHTING DEVICE COMPRISING THE SAME

(71) Applicant: LG INNOTEK CO., LTD., Seoul (KR)

(72) Inventors: Duk Hyun Yun, Seoul (KR); Dong Il Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 60 days.

(21) Appl. No.: 17/051,603

(22) PCT Filed: May 3, 2019

(86) PCT No.: PCT/KR2019/005339
§ 371 (c)(1),
(2) Date: Oct. 29, 2020

(87) PCT Pub. No.: WO2019/221431
PCT Pub. Date: Nov. 21, 2019

(65) Prior Publication Data
US 2021/0226106 A1    Jul. 22, 2021

(30) Foreign Application Priority Data

May 18, 2018    (KR) .................. 10-2018-0057408

(51) Int. Cl.
*H01L 33/58* (2010.01)
*H01L 23/538* (2006.01)
(Continued)

(52) U.S. Cl.
CPC .......... *H01L 33/58* (2013.01); *G02B 19/0014* (2013.01); *G02B 19/0066* (2013.01);
(Continued)

(58) Field of Classification Search
CPC ......... H01L 2933/0058; H01L 25/0753; H01L 27/14627; H01L 33/58; H01L 33/405;
(Continued)

(56) References Cited

U.S. PATENT DOCUMENTS 7,288,798 B2    10/2007  Chang
2005/0212089 A1  9/2005  Kiyomoto et al.
(Continued)

FOREIGN PATENT DOCUMENTS

KR    10-2002-0067533 A    8/2002
KR    10-2008-0054921 A    6/2008
(Continued)

OTHER PUBLICATIONS

International Search Report (with English Translation) and Written Opinion dated Aug. 16, 2019 issued in Application No. PCT/KR2019/005339.
(Continued)

*Primary Examiner* — Feifei Yeung Lopez
(74) *Attorney, Agent, or Firm* — KED & Associates, LLP

(57) ABSTRACT

A lighting device disclosed in an embodiment of the invention includes a substrate; a plurality of light emitting devices disposed on the substrate; a resin layer disposed on the substrate and the plurality of light emitting devices and including a lens portion; and a plurality of recess portions that seal a periphery of each of the light emitting devices and form a space spaced apart between the lens portion and the substrate. The resin layer includes a flat upper surface and a lower surface disposed on the substrate, and the lens portion may include a protrusion portion protruding toward a central portion of the light emitting device, a first incident surface having a convex curved surface around the protrusion portion, and a second incident surface extending perpendicular to the substrate from a lower portion of the first incident surface. A distance from an upper surface of the resin layer to the lower end of the protrusion portion is less than a thickness of the resin layer and is more than twice a distance from the upper surface of the resin layer to a high point of
(Continued)

the first incident surface, and the refractive index of the recess portion is 1.2 or less.

20 Claims, 12 Drawing Sheets

(51) Int. Cl.
    *H01L 25/075* (2006.01)
    *H01L 33/38* (2010.01)
    *H01L 33/40* (2010.01)
    *H01L 33/44* (2010.01)
    *H01L 33/50* (2010.01)
    *H01L 33/62* (2010.01)
    *H01L 27/146* (2006.01)
    *G02B 19/00* (2006.01)

(52) U.S. Cl.
    CPC ...... *H01L 23/5387* (2013.01); *H01L 25/0753* (2013.01); *H01L 27/14627* (2013.01); *H01L 33/382* (2013.01); *H01L 33/405* (2013.01); *H01L 33/44* (2013.01); *H01L 33/505* (2013.01); *H01L 33/62* (2013.01); *H01L 2933/0041* (2013.01); *H01L 2933/0058* (2013.01)

(58) Field of Classification Search
    CPC .............. H01L 33/505; G02B 19/0066; G02B 19/0014
    See application file for complete search history.

(56) References Cited

U.S. PATENT DOCUMENTS

| | | |
|---|---|---|
| 2010/0265694 A1 | 10/2010 | Kim et al. |
| 2012/0113621 A1* | 5/2012 | Lee .......................... F21V 5/10 156/245 |
| 2013/0135876 A1* | 5/2013 | Phillips, III ....... G02B 19/0014 362/335 |
| 2014/0376219 A1 | 12/2014 | Ono |

FOREIGN PATENT DOCUMENTS

| | | |
|---|---|---|
| KR | 10-2012-0000813 A | 6/2010 |
| KR | 10-2012-0069045 A | 12/2010 |
| KR | 10-2011-0115739 A | 10/2011 |
| KR | 10-2013-0095939 A | 8/2013 |
| KR | 10-2014-0007510 A | 1/2014 |
| WO | WO 2017/114692 | 7/2017 |

OTHER PUBLICATIONS

European Search Report dated Jan. 26, 2022 issued in Application No. 19803705.3.

\* cited by examiner (a)

(b)

(a)

(b)

LIGHTING MODULE AND LIGHTING DEVICE COMPRISING THE SAME

CROSS-REFERENCE TO RELATED PATENT APPLICATIONS

This application is a U.S. National Stage Application under 35 U.S.C. § 371 of PCT Application No. PCT/KR2019/005339, filed May 3, 2019, which claims priority to Korean Patent Application No. 10-2018-0057408, filed May 18, 2018, whose entire disclosures are hereby incorporated by reference.

TECHNICAL FIELD

An embodiment of the invention relates to a lighting module having a light emitting device. An embodiment of the invention relates to a lighting module having an air lens between a light emitting device and a resin layer. An embodiment of the invention relates to a lighting module that provides a surface light source, a light unit having the same, or a vehicle lamp.

BACKGROUND ART

Typical lighting applications include vehicle lights as well as backlights for displays and signs. Light emitting devices, for example, light emitting diodes (LEDs) have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since the emission angle of light emitted from the light emitting diode is small, when the light emitting diode is used as a vehicle lamp, there is a demand for increasing the light emitting area of the lamp using the light emitting diode. Light emitting diodes can increase the design freedom of lamps because of their small size, and are economical due to their semi-permanent lifetime.

DISCLOSURE

Technical Problem

An embodiment of the invention may provide a lighting module that provides a surface light source. An embodiment of the invention provides a lighting module having a resin layer in which a lens portion having an air space is disposed on a plurality of light emitting devices. An embodiment of the invention provides a lighting module including a resin layer having a lens portion on a light emitting device having a convex protrusion portion in a direction of the light emitting device and a lens portion having a curved exit surface. An embodiment of the invention provides a flexible lighting module having a plurality of light emitting devices and a resin layer. An embodiment of the invention provides a lighting module with improved light extraction efficiency and light distribution characteristics. An embodiment of the invention may provide a lighting module, a lighting device, a light unit, a liquid crystal display device, or a vehicle lamp that irradiates a surface light source.

Technical Solution

A lighting device according to an embodiment of the invention includes a substrate; a plurality of light emitting devices disposed on the substrate; a resin layer disposed on the substrate and the plurality of light emitting devices and including a lens portion; and a plurality of recess portions that seal a periphery of each of the light emitting devices and form a space spaced apart between the lens portion and the substrate. The resin layer includes a flat upper surface and a lower surface disposed on the substrate, and the lens portion includes a protrusion portion protruding toward a central portion of the light emitting device, a first incident surface having a convex curved surface around the protrusion portion, and a second incident surface extending perpendicular to the substrate from a lower portion of the first incident surface. A distance from an upper surface of the resin layer to a lower end of the protrusion portion is less than a thickness of the resin layer and is more than twice a distance from the upper surface of the resin layer to a high point of the first incident surface, and the refractive index of the recess may be 1.2 or less.

According to an embodiment of the invention, a distance between the protrusion portion of the lens portion and the substrate may be greater than a height of the second incident surface. The maximum height of the lens portion may range from 80% to 90% of a vertical distance from the lower surface of the resin layer to the upper surface of the resin layer. According to an embodiment of the invention, a phosphor layer may be included on the upper surface of the resin layer. A part of the phosphor layer may extend on all sides of the resin layer and may contact the substrate. The phosphor layer includes a light blocking portion overlapping a protrusion portion of the lens portion in a perpendicular direction to the substrate. The light blocking portion may have a content of phosphor higher than a content of phosphor of the phosphor layer between the lens portions. According to an embodiment of the invention, a width of the recess portion parallel to the substrate may be greater than a thickness of the resin layer perpendicular to the substrate. The lower surface of the resin layer is adhered to the upper surface of the substrate with an adhesive, and the resin layer may include the recess portion and the lens portion at the lower portion thereof.

A lighting device according to an embodiment of the invention includes a substrate; a plurality of light emitting devices disposed on the substrate; a resin layer disposed on the substrate and the plurality of light emitting devices; a phosphor layer on the resin layer; and a plurality of recess portions disposed on an upper portion and circumference of each of the light emitting devices, wherein the resin layer is disposed at an upper portion and a side portion of the recess portion, and the resin layer forming the recess portion comprises a protrusion portion protruding toward the light emitting device, a first incidence surface having a curved surface convex in opposite directions based on the protrusion portion, and a second incidence surface extending from an end of the first incidence surface toward the substrate. The shortest distance from a lower point of the protrusion portion to an upper surface of the resin layer is smaller than a thickness of the resin layer and is more than twice a distance from the upper surface of the resin layer to the high point of the first incident surface and a width of the recess portion is greater than the thickness of the resin layer. A refractive index of the recess portion may be smaller than that of the resin layer.

According to an embodiment of the invention, an interval between the plurality of recess portions may be smaller than the maximum width of the recess portions, the substrate is a flexible circuit board, the recess portions includes air, and the resin layer may be formed of a transparent silicon. According to an embodiment of the invention, a light shielding portion overlapping the recess portion in a direction perpendicular to the substrate on an upper or lower surface of the phosphor layer, and a side cross-section of the first incident surface has a hyperbolic shape in a direction opposite to each other with respect to the protrusion portion, and an upper surface and a side surface of the phosphor layer may be spaced apart from the recess portion.

Advantageous Effects

According to an embodiment of the invention, the light uniformity of the surface light source in the lighting module may be improved. In the lighting module, the number of light emitting devices may be reduced by the resin layer having the air lens portion, and a decrease in uniformity of the light source due to the decrease of the light emitting devices may be suppressed by the resin layer having the air lens portion. Since the light scattered in the lighting module may be converted by a phosphor, hot spots on each light emitting device may be reduced. A light shielding portion is provided on the lighting module to suppress hot spots through the lens portion. The light efficiency and light distribution characteristics of the lighting module may be improved. Therefore, it is possible to improve the optical reliability of the lighting module and the lighting device having the same. Reliability of a vehicle lighting device, a backlight unit, various display devices, a surface light source lighting device, or a vehicle lamp having a lighting module according to the embodiment may be improved.

Figure 2:
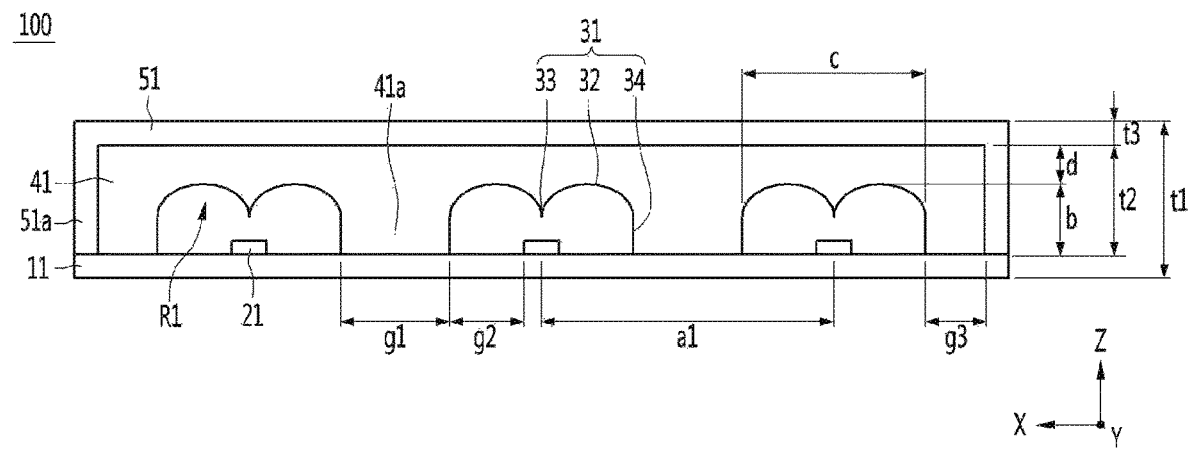
FIG. 2 is a cross-sectional view of A-A side of the lighting module of FIG. 1.
Figure 9:
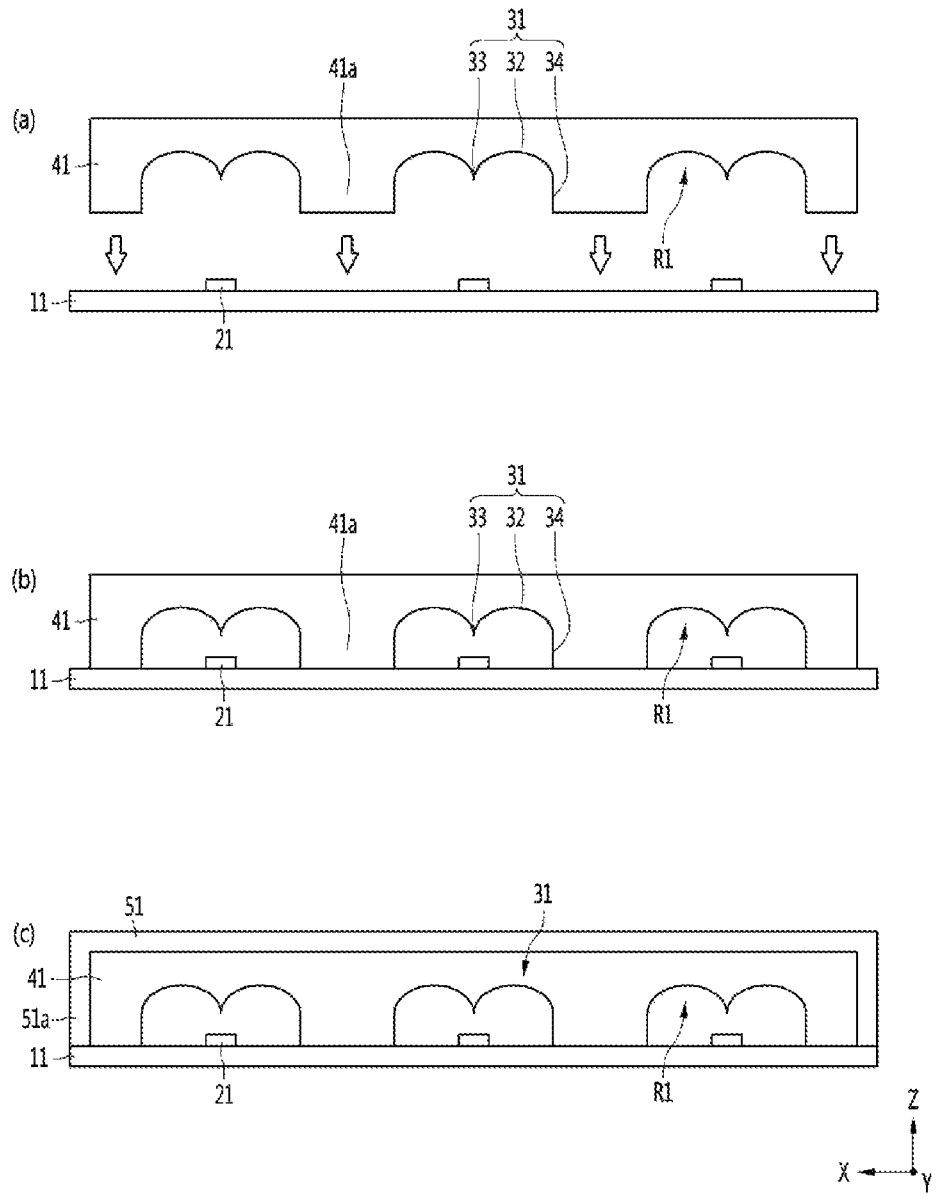

(a) (b) (c) of FIG. 9 is a diagram illustrating a manufacturing process of the lighting module of FIG. 2.

Figure 10:
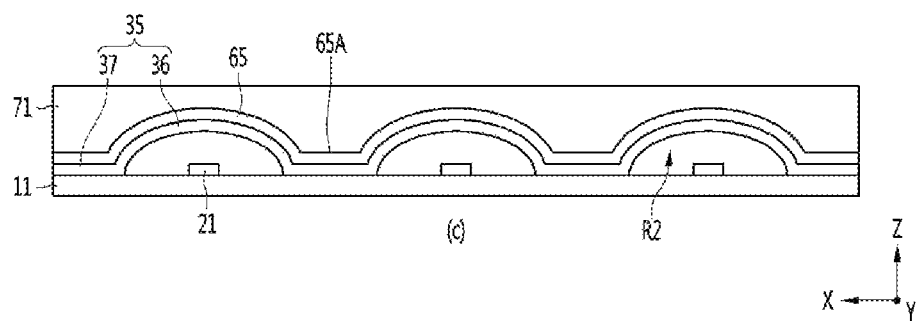

FIG. 10 is an example of a side cross-sectional view of a lighting module according to a third embodiment of the invention.

Figure 11:
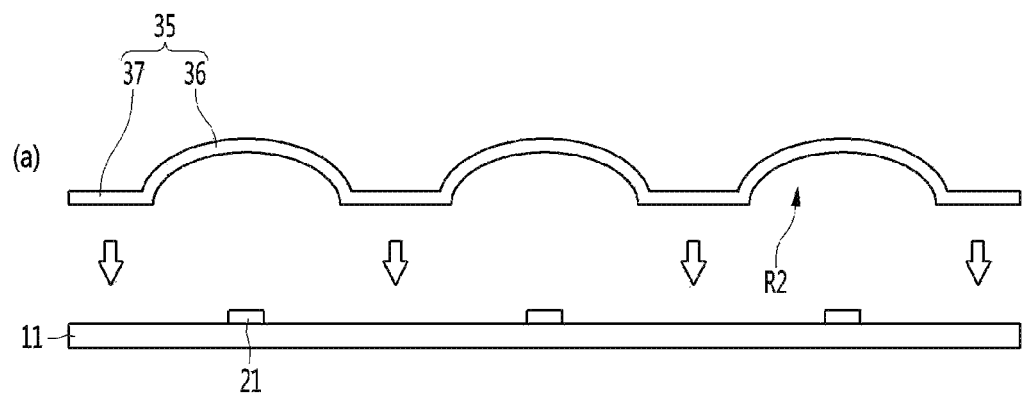
Figure 11:
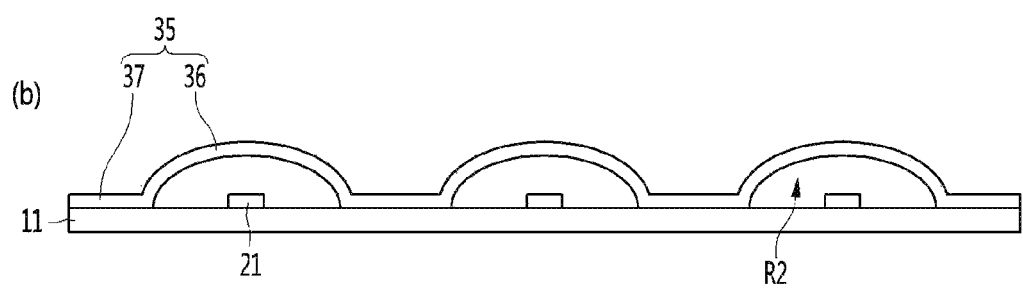
Figure 11:
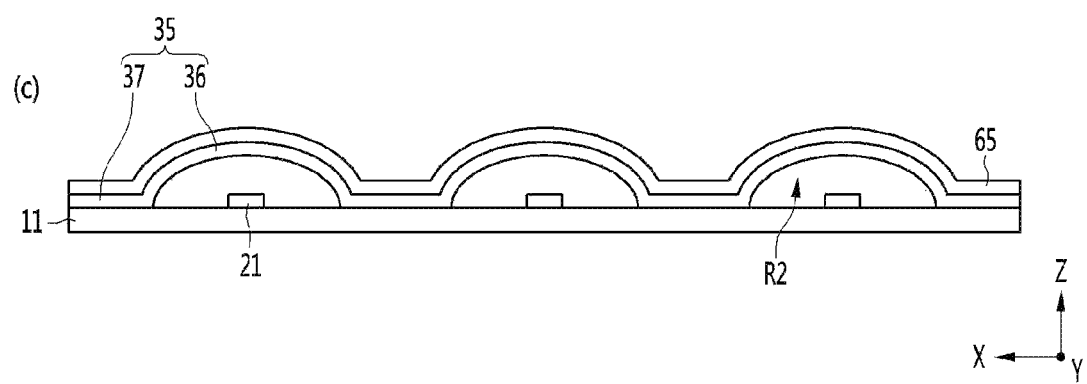

(a) (b) (c) of FIG. 11 is a view illustrating a manufacturing process of the lighting module of FIG. 10.

FIGS. 12A and 12B are views showing a beam angle distribution, a light distribution, and a luminous intensity by the lighting module of a comparative example without a lens portion.

Figure 13:
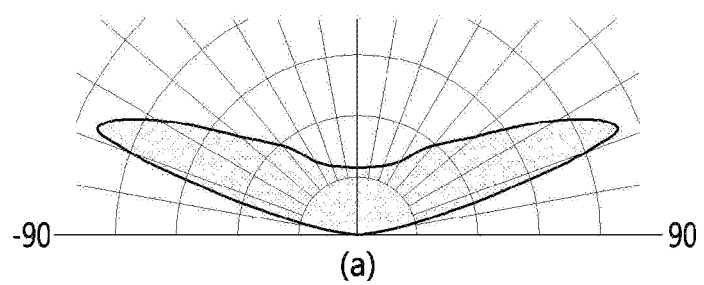
Figure 13:
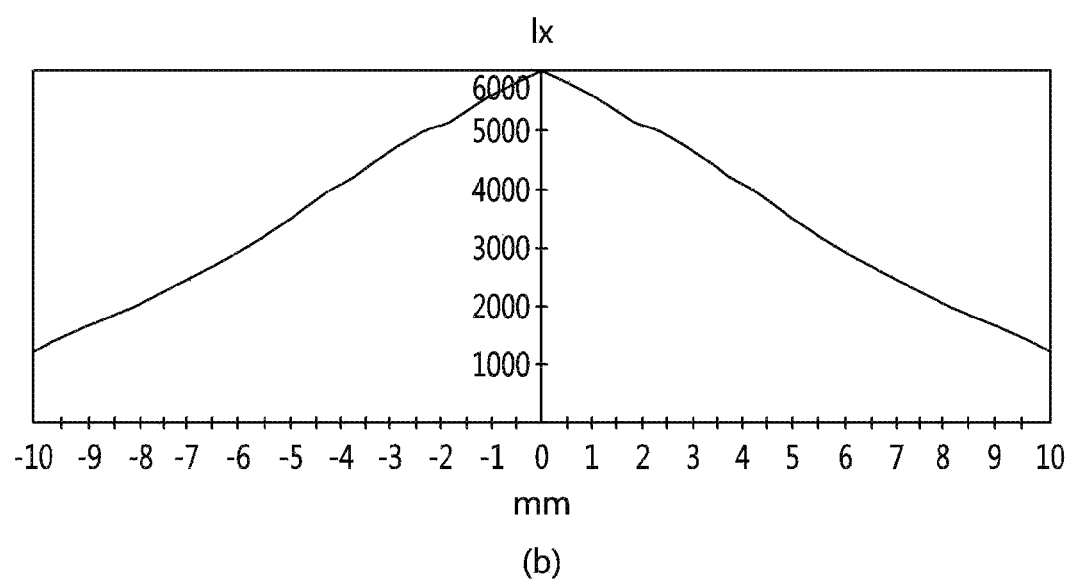

FIGS. 13A and 13B are views showing a beam angle distribution, a light distribution, and a luminous intensity by a lighting module according to an embodiment of the invention.

Figure 14:
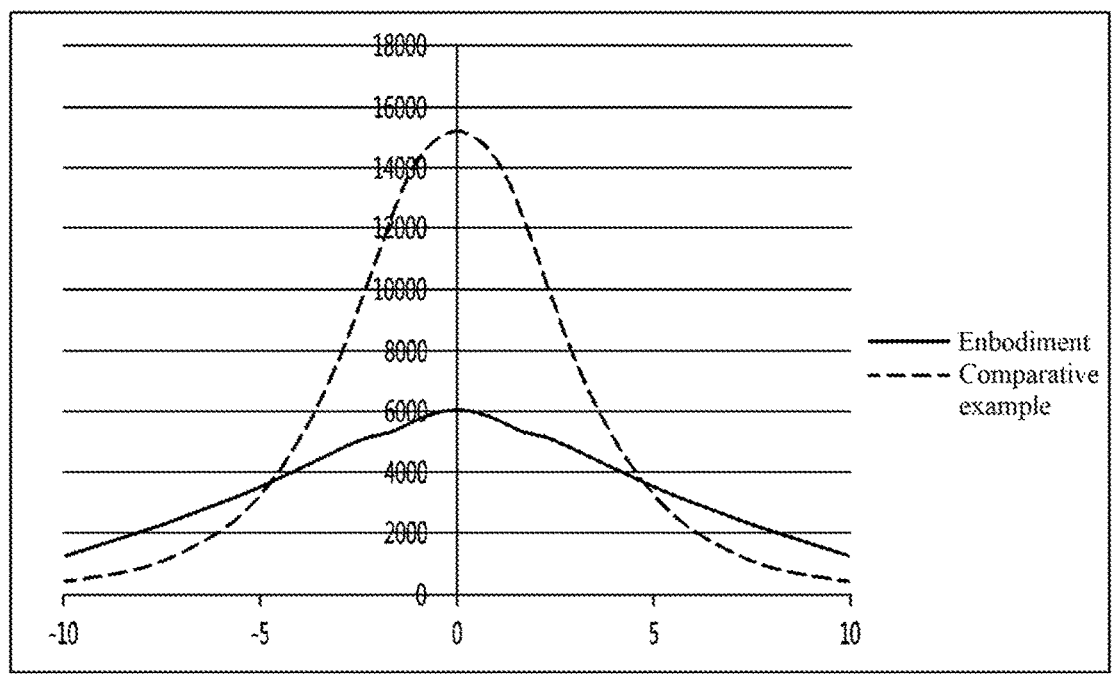

FIG. 14 is a graph comparing luminous intensity of a lighting module according to a comparative example and an embodiment of the invention.

Figure 15:
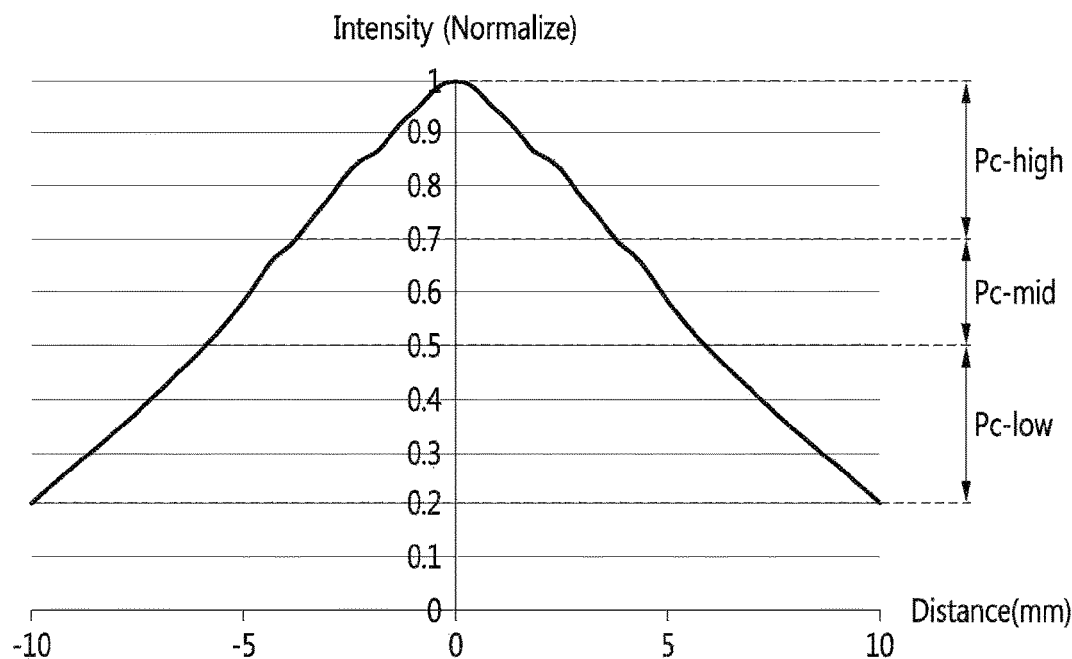

FIG. 15 is a graph showing changes in luminous intensity according to phosphor content in the lighting module according to the second embodiment of the invention.

Figure 16:
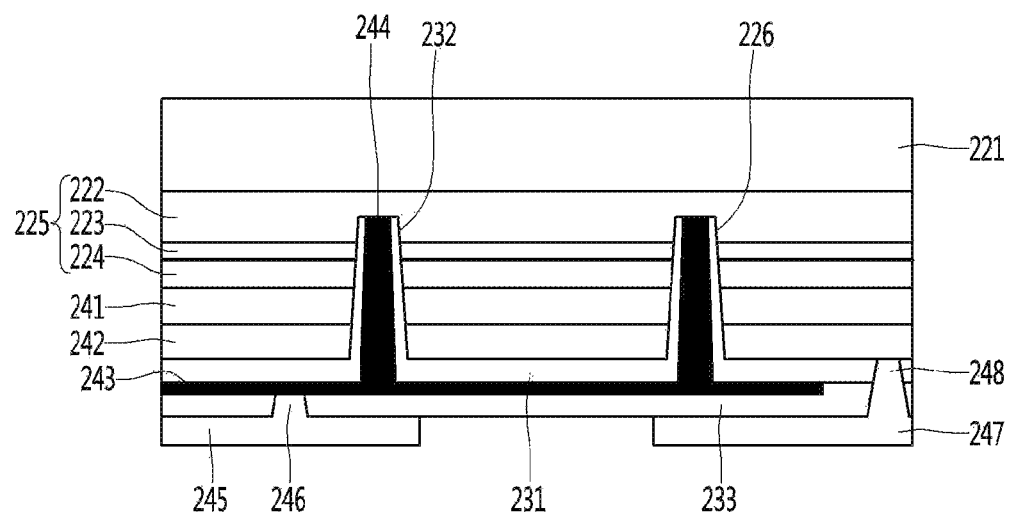

FIG. 16 is a view showing an example of a light emitting device according to an embodiment of the invention.

Figure 17:
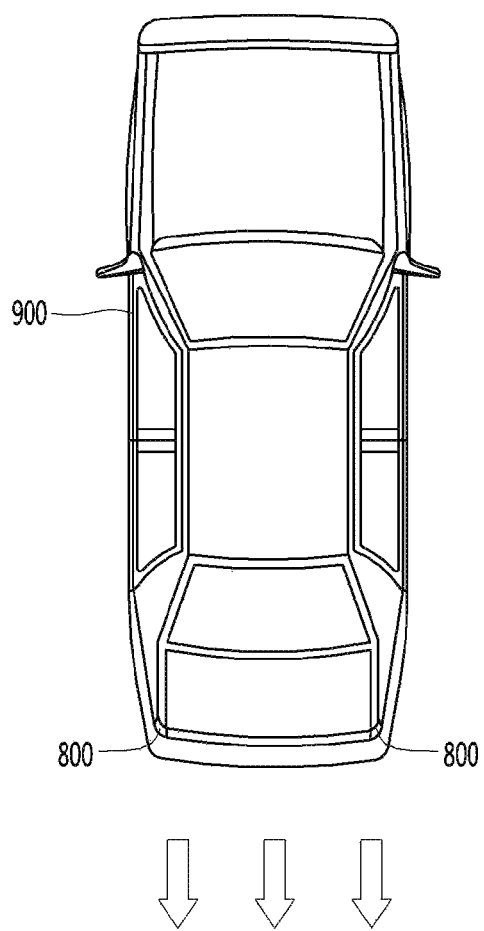

FIG. 17 is a plan view of a vehicle to which a lamp having a lighting module according to an embodiment is applied.

Figure 18:
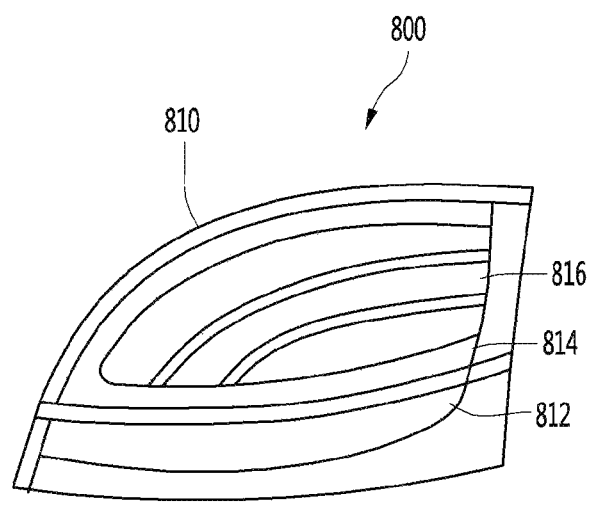

FIG. 18 is a view illustrating a lamp having a lighting module or a lighting device according to an embodiment.

BEST MODE

Hereinafter, preferred embodiments of the invention will be described in detail with reference to the accompanying drawings, in which a person having ordinary skill in the art to which the invention pertains can easily implement the invention. However, it should be understood that embodiments described in the specification and configurations illustrated in the drawings are merely a preferred embodiment of the invention, and there are various equivalents and modifications that can substitute the embodiments and configurations at the time of filing the present application.

In describing operating principles of a preferred embodiment of the invention in detail, when detailed description of a known function or configuration is deemed to unnecessarily blur the gist of the present disclosure, the detailed description will be omitted. Terms to be described below are defined as terms defined in consideration of functions of the invention and meaning of each term should be interpreted based on the contents throughout the specification. The same reference numerals are used for parts having similar functions and actions throughout the drawings.

A lighting device according to the invention may be applied to various lamp devices requiring lighting, for example, a vehicle lamp, a home lighting device, or an industrial lighting device. For example, when a lighting device is applied to a vehicle lamp, it may be applied to a head lamp, a side mirror lamp, a fog lamp, a tail lamp, a stop lamp, a side marker lamp, a daytime running light, a vehicle interior lighting, a door scarf, rear combination lamps, a backup lamp, and the like. The lighting device of the invention may also be applied to indoor and outdoor advertisement apparatus fields, and also may be applicable to all other lighting-related fields and advertisement-related fields that are currently being developed and commercialized or that may be implemented by technological development in the future. Hereinafter, embodiments will be shown more apparent through the description of the appended drawings and embodiments. In the description of the embodiments, in the case in which each layer (film), area, pad or pattern is described as being formed "on" or "under" each layer (film), area, pad or pattern, the "on" and "under" include both of forming "directly" and "indirectly". Also, the reference for determining "on" or "under" each layer will be described based on the figures.

Figure 1:
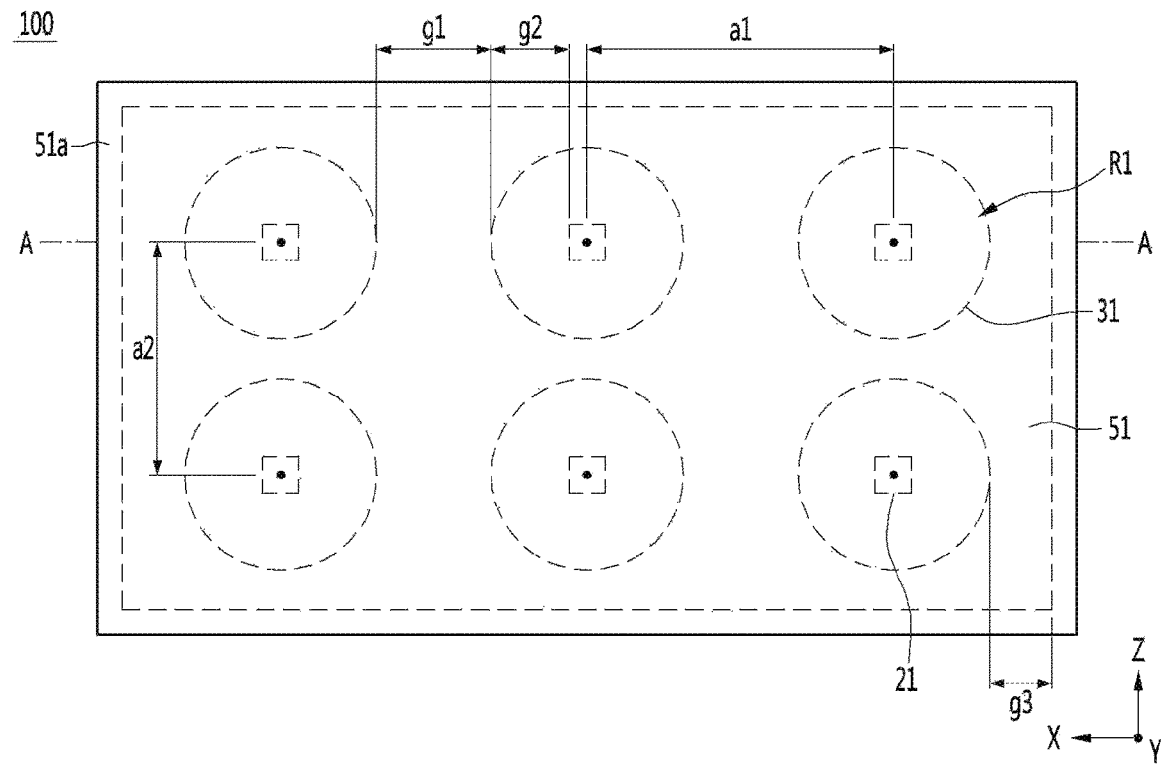
FIG. 1 is a perspective view showing a lighting module according to a first embodiment of the invention.
Figure 3:
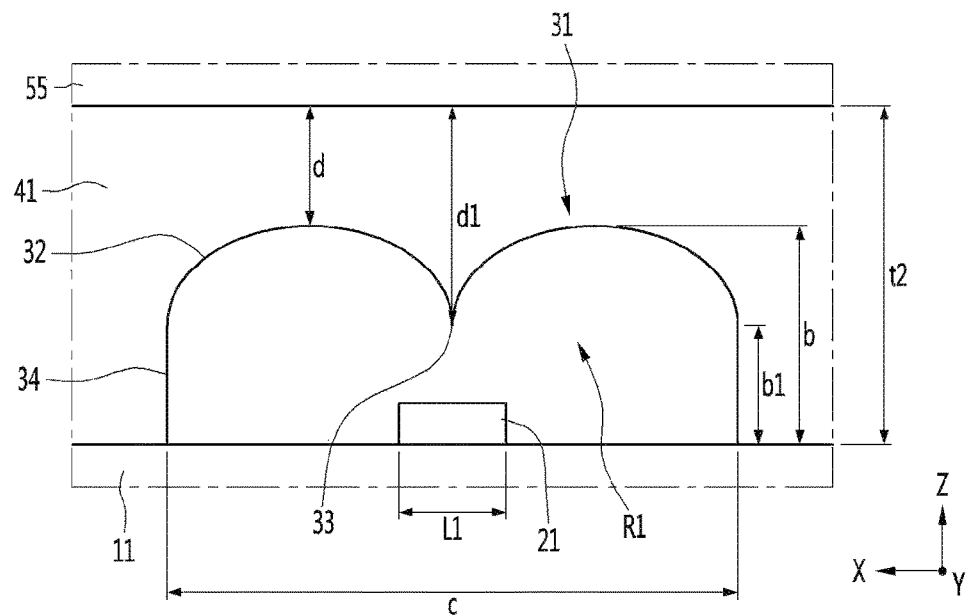
FIG. 3 is a detailed configuration view of a lens portion in the lighting module of FIG. 2.

FIG. 1 is a plan view illustrating a lighting module according to an embodiment, FIG. 2 is an example of a cross-sectional view of A-A side of the lighting module of FIG. 1, and FIG. 3 is an enlarged view of a lens portion of the lighting module of FIG. 2.

Referring to FIGS. 1 to 3, the lighting module 100 includes a substrate 11, a plurality of light emitting devices 21 disposed on the substrate 11, and a resin layer 41 disposed on the plurality of light emitting devices 21 and disposed on the substrate 11, and a phosphor layer 51 disposed on the resin layer 41. The lighting module 100 may emit light emitted from the light emitting device 21 to a surface light source. The lighting module 100 may include a reflective member disposed on the substrate 11. In the lighting module 100, the plurality of light emitting devices 21 may be arranged in N columns (N is an integer greater than or equal to 1). One or more of the plurality of light emitting devices 21 may be arranged in a first direction (X) and a second direction (Y), for example, N columns and M rows (N, M are integers of 2 or more). The lighting module 100 may be applied to various lamp devices that require lighting, such as a vehicle lamp, a home lighting device, or an industrial lighting device. For example, in the case of lighting modules applied to vehicle lamps, head lamps, vehicle width lights, side mirror lights, fog lights, tail lamps, turn signal lamps, back up lamps, and stop lamps, daytime running light, vehicle interior lighting, door scarf, rear combination lamp, or backup lamp.

Referring to FIGS. 1 and 2, the substrate 11 includes a printed circuit board (PCB) having a circuit pattern. The substrate 11 may include, for example, a resin-based printed circuit board (PCB), a metal core PCB, a flexible PCB, a ceramic PCB, and an FR-4 substrate. The substrate 11 may include, for example, a flexible PCB. The upper surface of the substrate 11 has an X-Y axis plane, and the thickness of the substrate 11 may be a height in the Z direction orthogonal to the X and Y directions. Here, the X direction is a first direction, the Y direction is a second direction orthogonal to the X direction, and the Z direction may be a vertical direction or a third direction orthogonal to the X and Y directions.

The substrate 11 includes a wiring layer (not shown) such as a circuit pattern thereon, and the wiring layer may be electrically connected to the light emitting device 21. When the light emitting devices 21 are arranged in plural on the substrate 11, the plurality of light emitting devices 21 may be connected in series, parallel, or in series-parallel by the wiring layer, but the embodiment is not limited thereto. The substrate 11 may function as a base member or a support member positioned under the light emitting device 21 and at least one layer.

The length of the substrate 11 in the X direction and the length in the Y direction may be the same or different from each other. For example, the length in the X direction of the substrate 11 may be longer than the length in the Y direction, for example, may be arranged to be twice or more. A portion of the substrate 11 may protrude further outward than at least one side or two side surfaces of the resin layer 41.

The thickness of the substrate 11 may be 0.5 mm or less, for example, in the range of 0.3 mm to 0.5 mm. Since the thickness of the substrate 11 is provided to be thin, the thickness of the lighting module may not be increased. Since the substrate 11 is provided with a thin thickness, a flexible lighting module may be provided.

The thickness t1 of the lighting module 100 is a distance from the lower surface of the substrate 11 to the upper surface of the phosphor layer 51. The thickness t1 of the lighting module 100 may be 5.5 mm or less from the lower surface of the substrate 11, for example, 4.5 mm to 5.5 mm or 4.5 mm to 5 mm. The thickness t1 of the lighting module 100 may be a linear distance between the lower surface of the substrate 11 and the upper surface of the phosphor layer 51.

The thickness t1 of the lighting module 100 may be 220% or less of the thickness t2 of the resin layer 41, for example, in the range of 180% to 220%. When the thickness t1 of the lighting module 100 is thinner than the above range, a hot spot may occur due to a decrease in the light diffusion space, and when it is greater than the thickness range, the installation restriction and the spatial design freedom may be reduced due to the module thickness. In the embodiment, the thickness t1 of the lighting module 100 is 5.5 mm or less, for example, 5 mm or less, so that a curved structure is possible, thereby reducing design freedom and space constraints. Accordingly, the lighting module 100 may be used as a flexible lighting. The ratio of the length of the lighting module 100 in the Y direction to the thickness of the lighting module 100 may be 1:m, may have a ratio relationship of m≥1, and the m is a natural number of at least 1, The row of the light emitting device 21 may be an integer smaller than the m. For example, when the m is 4 times or more larger than the thickness of the lighting module 100, the light emitting devices 21 may be arranged in 4 rows.

The substrate 11 may be provided with a connector in a part to supply power to the light emitting devices 21. A region on the substrate 11 in which the connector is disposed may be a region in which the resin layer 41 is not formed. When the connector is disposed on the lower surface of the substrate 11, the part region may be removed. The substrate 11 may have a rectangular top view, a square shape, or another polygonal shape, and may be a bar shape having a curved shape. That is, the lighting module 100 may have a line shape or a bar shape having two or less rows of light emitting devices, or a plate shape having two or more rows of light emitting devices.

The substrate 11 may include a protective layer or a reflective layer thereon. The protective layer or the reflective layer may include a member having a solder resist material, and the solder resist material is a white material, and may reflect incident light.

The light emitting device 21 may be disposed on the substrate 11 and may be disposed under the resin layer 41. The light emitting device 21 may be disposed between the substrate 11 and the resin layer 41. The light emitting device 21 may be sealed with air. Each of the plurality of light emitting devices 21 may be sealed with air. The refractive index of the space provided by the recess portion R1 may be 1.2 or less. The resin layer 41 may include a recess portion R1 having the air space and a lens portion 31 on the recess portion R1. The light emitted from the light emitting device 21 is diffused within the space of the recess portion R1, and the light diffused through the lens portion 31 of the resin layer 41 is emitted.

The light emitting device 21 is an LED chip that emits light on at least five surfaces, and may be disposed on the substrate 11 in a flip chip type. As another example, the light emitting device 21 may be a horizontal type chip or a vertical type chip. In the horizontal chip, two different electrodes may be disposed in a horizontal direction, and in the vertical chip, two different electrodes may be disposed in a vertical direction. In the case of the horizontal chip or the vertical chip, the light emitting device 21 is connected to another chip or wiring pattern with a wire, so the thickness of the module may increase due to the height of the wire, and a pad space for bonding of the wire may be needed.

The light emitting device 21 may be provided with a thickness of 0.3 mm or less, for example, in a range of 0.15 mm to 0.3 mm. In the light emitting device 21 according to the embodiment, the distribution of the angle of beam spread is increased due to the five-sided light emission, so that the distance a1 between the light emitting devices 21 may be greater than the thickness t2 (t2<a1) of the resin layer 41. The interval a1 may be, for example, 8 mm or more, for example, in the range of 8 mm to 15 mm. The interval a1 between the light emitting devices 21 may be at least twice the thickness t2 of each resin layer 41. Since the interval a1 between the light emitting devices 21 is increased by the recess portion R1 and the lens portion 31 of the resin layer 41, the number of the light emitting device 21 mounted in the lighting module 100 may reduce.

The light emitting device 21 disclosed in the embodiment is provided as a flip chip that emits light on at least five sides, thereby improving luminance distribution and the distribution of the angle of beam spread. When the light emitting devices 21 are arranged in an N×M matrix on the substrate 11, the N may be one or two or more columns, and the M may be one or two or more columns. The N and M are integers of 1 or more. The light emitting devices 21 may be arranged in the Y-axis and X-axis directions, respectively.

The light emitting device 21 is a light emitting diode (LED) chip and may emit at least one of blue, red, green, ultraviolet (UV) and infrared rays. The light emitting device 21 may emit, for example, at least one of blue, red, and green light. The light emitting device 21 may be electrically connected to the substrate 11, but is not limited thereto.

A surface of the light emitting device 21 may be sealed with a transparent insulating layer or a resin layer, but the embodiment is not limited thereto. A layer having a phosphor having a phosphor may be attached to a surface of the light emitting device 21, but the embodiment is not limited thereto.

The light emitting device 21 may have a support member having a ceramic support member or a metal plate disposed thereunder, and the support member may be used as an electrical conduction and heat conduction member.

A plurality of layers is disposed on the light emitting device 21 according to the embodiment, and the plurality of layers may include, for example, two or more layers or three or more layers. The plurality of layers may selectively include at least two or three or more layers from among a layer without impurities, a layer to which a phosphor is added, a layer with a diffusion agent, and a layer to which a phosphor/diffusion agent is added. The diffusion agent and the phosphor may be selectively included in the plurality of layers. That is, the phosphor and the diffusion agent may be disposed in separate layers from each other, or may be mixed with each other and disposed in one layer. The impurities may be a phosphor and the diffusion agent. The layers including the phosphor and the diffusion agent may be disposed adjacent to each other or may be disposed spaced apart from each other. When the phosphor and the layer on which the diffusion agent is disposed are separated from each other, the layer on which the phosphor is disposed may be disposed above the layer on which the diffusion agent is disposed.

The phosphor may include at least one of a blue phosphor, a green phosphor, a red phosphor, and a yellow phosphor. The size of the phosphor may range from 1 μm to 100 μm. The higher the density of the phosphor, the higher the wavelength conversion efficiency may be, but since the luminous intensity may be lowered, it may be added in consideration of the light efficiency within the above size. The diffusion agent may include at least one of PMMA (Poly Methyl Meth Acrylate) series, $TiO_2$, $SiO_2$, $Al_2O_3$, and silicon series. The diffusing agent may have a refractive index in the range of 1.4 to 2 at the emission wavelength, and its size may be in the range of 1 μm to 100 μm or in the range of 1 μm to 30 μm. The diffusion agent may have a spherical shape, but is not limited thereto. Since impurities such as the diffusion agent and the phosphor are disposed, the uniformity of light in a region in which the light emitting devices are connected to each other may be provided as 90% or more. The plurality of layers disposed on the substrate 11 may include a resin material. The plurality of layers may have the same refractive index, or at least two layers may have the same refractive index. The plurality of layers may have a refractive index gradually lowered or a difference in refractive index of 0.5 or less as the layer adjacent to the uppermost side.

The resin layer 41 is disposed on the substrate 11 and seals the circumference of the light emitting device 21. The resin layer 41 may be thicker than the thickness of the light emitting device 21. The resin layer 41 may be a transparent resin material, for example, a resin material such as UV (Ultraviolet) resin, silicone, or epoxy. The resin layer 41 may be a layer without a diffusion agent, a layer with a diffusion agent, or a molding layer.

The resin layer 41 may include a diffusion agent. The diffusion agent may be added in the range of 1.5 wt % to 2.5 wt % in the resin layer 41. The refractive index of the resin layer 41 having the diffusing agent may be 1.8 or less, for example, 1.1 to 1.8 or 1.4 to 1.6, and may be lower than the refractive index of the diffusing agent. The refractive index of the resin material may be 1.8 or less, for example, in the range of 1.1 to 1.8 or in the range of 1.4 to 1.6, and may be lower than the refractive index of the diffusing agent. The UV resin may be, for example, a resin (oligomer type) containing a urethane acrylate oligomer as a main material. For example, it is possible to use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photo initiator to be able to perform a function of initiating photo reactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The thickness t2 of the resin layer 41 may be thicker than the thickness of the substrate 11, for example, 5 times or more than the thickness of the substrate 11, for example, in the range of 5 times to 9 times. Since the resin layer 41 is disposed at the above thickness t2, the resin layer 41 may seal the periphery of the light emitting device 21 on the substrate 11, may prevent the moisture penetration, and may support the substrate 11. The resin layer 41 and the substrate 11 may be formed of a flexible plate. The thickness t2 of the resin layer 41 may be 4 mm or less, for example, 2 mm to 4 mm or 2 mm to 3.5 mm.

As shown in FIG. 2, the resin layer 41 may include a plurality of recess portions R1 and a lens portion 31 on the recess portions R1. The recess portions R1 are respectively disposed on the light emitting device 21 and seal the light emitting device 21. The recess portion R1 is a material of air, and may include at least one of air, for example, oxygen, nitrogen, or argon gas. The recess portion R1 may be in a vacuum state. When the recess portion R1 is in a vacuum state, it is possible to prevent the occurrence of moisture due to temperature change. The recess portion R1 may be disposed between the light emitting device 21 and the lens portion 31. A width (e.g., c) of the recess portion R1 in the first and second directions may be greater than a maximum height b (c>b).

The lens portion 31 may have a circular top-view shape. When the lens portion 31 has a circular shape, the circumference of the lens portion 31 may be spaced apart at the same distance g2 as the light emitting device 21. The lens portion 31 may have an oval shape, and in this case, opposite sides of the light emitting device 21 are spaced apart at the same interval as the lens portion 31, or adjacent surfaces of the light emitting device 21 may be spaced from with the lens portions 31 at different intervals. The interval g1 between the lens portions 31 may be smaller than the interval a1 (a1>g1) between the light emitting devices 21. A portion 41a of the resin layer 41 may be disposed in a region between the lens portions 31 and may contact the upper surface of the substrate 11. The resin layer 41 is disposed around the lens portion 31 to guide the light emitted through the lens portion 31. When a diffusing agent is added inside the resin layer 41, the light emitted through the lens portion 31 may be diffused.

The interval g1 between the lens portions 31 may be greater than a interval g3 between the lens portion 31 and a side surface of the resin layer 41. The length c of the lens portion 31 in the first direction or the second direction may be greater than the interval g1 between the lens portions 31. The linear distance g2 between the side surface of the lens portion 31 and the light emitting device 21 may be smaller than the interval g1 between the lens portions 31. The length c of the lens portion 31 in the first direction or the second direction may be the maximum width of the recess portion R1 and may be greater than the interval g1 between the lens portions 31.

Here, the sizes of the lens portions 31 may be the same. As another example, some of the lens portions 31 may have different sizes. For example, when the size of the lens portion 31 is 3 or more in M rows and N columns, the size of the outer lens portion 31 may be smaller than the size of the center lens portion 31. That is, the size of the lens portion 31 may be provided in a different size depending on the region. The height or thickness b of the lens portion 31 may be 0.9 times or less, for example, 0.8 times to 0.9 times the thickness t2 of the resin layer 41. The height b of the upper surface of the lens portion 31 may be 90% or less, for example, in the range of 80% to 90% of the upper surface of the resin layer 41. When the height b of the lens portion 31 is smaller than the above range, the light diffusion efficiency is low and there is a limit to reducing hot spots, and when it is larger than the above range, the strength of the resin layer 41 may be reduced and the light loss in the recess portion R1 may be increased.

The interval d between the upper surface of the resin layer 41 and the lens portion 31 may be 0.2 times or less, for example, 0.1 to 0.2 times the thickness t2 of the resin layer 41. When the interval d is smaller than the above range, the size of the lens portion 31 is reduced, so that the light diffusion efficiency is insignificant, and when it is larger than the above range, the strength of the resin layer 41 decreases and hot spots may occur.

The lens portion 31 may refract light emitted from the light emitting device 21 on the light emitting device 21. The lens portion 31 may be disposed on the substrate 11 in plural. The number of the lens portions 31 may be the same as the number of the light emitting devices 21. The lens portion 31 may include a protrusion portion 33, a first incident surface 32 and a second incident surface 34. The protrusion portion 33 may protrude convexly in the direction of the light emitting device 21 from the center of the first incident surface 32. The protrusion portion 33 may be disposed closer to the light emitting device 21 than to the first incidence surface 32. The protrusion portion 33 may correspond to or face the center of the light emitting device 21. The protrusion portion 33 may protrude toward the light emitting device 21 from the center of the lens portion 31.

The closer to the light emitting device 21 from the center of the first incident surface 32 may have a gradually narrower width. The protrusion portion 33 may overlap the light emitting device 21 in a vertical direction. Some of the light incident in the direction of the protrusion portion 33 is transmitted, and most of the light may be refracted or reflected by the first incident surface 32.

The first incidence surface 32 may include a curved surface convex in the upper surface direction of the resin layer 41 and dispose on the recess portion R1. The distance from the first incident surface 32 to the light emitting device 21 may gradually increase as the distance from the protrusion portion 33 increases. The distance from the first incident surface 32 to the light emitting device 21 may gradually increase as the first incident surface 32 is further from the direction of the optical axis Z perpendicular to the light emitting device 21. The first incidence surface 32 may be formed in a hyperbolic shape when viewed from a side cross-section. The first incident surface 32 may be formed in a hyperbolic shape based on the protrusion portion 33. The first incident surface 32 may be formed as a convex curved surface around the protrusion portion 33. The curved shape may include a hemispherical shape or a semi-elliptical shape. The first incident surface 32 may refract or reflect incident light. The light refracted by the first incident surface 32 may have an emission angle greater than the incident angle based on a vertical axis. Accordingly, the light refracted by the first incident surface 32 may be diffused in the lateral direction. Since the light incident by the lens portion 31 is diffused, the pitch or interval between the light emitting devices 21 may be provided wider.

The interval a1 between the light emitting devices 21 may be in the range of 1.2 times to 1.8 times the length of the lens portion 31, that is, the maximum length of the lens portion 31. The high point of the first incident surface 32 may be disposed higher than the low point of the protrusion portion 33. Accordingly, the light reflected by the surface of the protrusion portion 33 may proceed to the first incident surface 32 or proceed to the second incident surface 34 to be emitted. The high point region of the first incident surface 32 may not overlap the light emitting device 21 in a vertical direction. A region of 5% or less of the region of the first incident surface 32 may overlap the light emitting device 21 in a vertical direction. The first incident surface 32 may be disposed between the protrusion portion 33 and the second incident surface 34. The first incident surface 32 may be connected between the protrusion portion 33 and the second incident surface 34. An outer low point of the first incident surface 32 may be disposed equal to or lower than the low point of the protrusion portion 33. The interval d1 between the lower point of the protrusion portion 33 and the upper surface of the resin layer 41 may be at least twice, for example, in a range of 2 times to 4 times the interval d between the upper surface of the resin layer 41 and the lens portion 31. The interval d1 is a distance or shortest distance between the low point of the protrusion portion 33 and the upper surface of the resin layer 41, and may vary according to the curvature of the curved surface of the lens portion 31.

The second incident surface 34 may be disposed at the same distance g2 around the light emitting device 21. When the lens portion 31 has an elliptical shape, the second incident surface 34 may have different distances from both sides of the light emitting device in the first direction and the distances from both sides of the second direction. When the lens portion 31 has an oval shape, light may be diffused in a short length direction orthogonal to a long direction. The second incident surface 34 may be a surface perpendicular to the upper surface of the substrate 11. The second incident surface 34 may be a surface inclined with respect to the upper surface of the substrate 11. The second incident surface 34 refracts or reflects light incident from the light emitting device 21 or light reflected from the upper surface of the substrate 11. The second incident surface 34 may have a light emission angle smaller than the incident angle based on a vertical axis, for example, an optical axis. The height b1 of the second incident surface 34 (see FIG. 3) may be 2 mm or less from the bottom of the lens portion 31 or the upper surface of the substrate 11, for example, in a range of 0.5 mm to 2 mm. The height b1 of the second incident surface 34 may be less than or equal to 0.3 times the thickness t2 of the resin layer 41, for example, in a range of 0.2 times to 0.3 times. When the height b1 of the second incidence surface 34 is lower than the above range, an optical interference problem may occur in which light emitted to the first incidence surface 32 proceeds to another lens portion 31, and the when it is higher than the range, there may be a problem in that the light diffusion efficiency by the first incident surface 32 is low, and the luminous intensity of light emitted through the second incident surface 34 is not uniform. The first and second incidence surfaces 32 and 34 may be regions in contact with the recess portion R1, so that light emitted from the light emitting device 21 or light reflected from other regions may be refracted.

Figure 4:
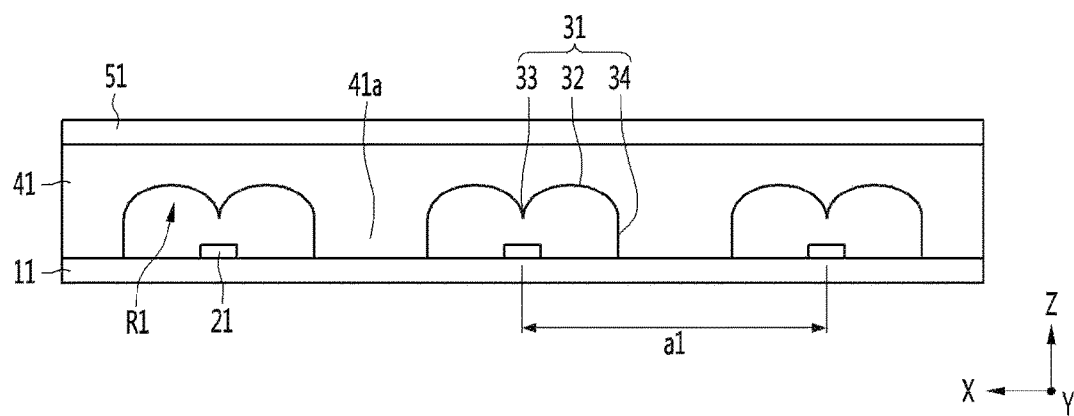
FIG. 4 is another example of the lighting module of FIG. 2.

A phosphor layer 51 may be disposed on the resin layer 41. The phosphor layer 51 may be disposed on an upper surface and a side surface of the resin layer 41. As shown in FIG. 4, the phosphor layer 51 may be disposed on an upper surface of the resin layer 41, and a side surface of the resin layer 41 may be exposed from the phosphor layer 51. The side portion 51a of the phosphor layer 51 extends to all sides of the resin layer 41 and may contact the upper surface of the substrate 11. The side portion 51a may prevent moisture penetration and extract wavelength-converted light in the same manner as other regions.

The phosphor layer 51 may be a material different from or the same material as the resin material of the resin layer 41. The phosphor layer 51 may be a transparent layer, and may include a phosphor therein. The phosphor layer 51 may include one or more types of phosphors, such as at least one of a red phosphor, a green phosphor, a blue phosphor, and a yellow phosphor. The phosphor layer 51 may include a red phosphor. Since the phosphor layer 51 includes a phosphor therein, the wavelength of incident light may be converted.

Here, when the light emitted from the light emitting device 21 is a first light and the light converted from the phosphor layer 51 is a second light, the second light may have a longer wavelength than the first light. The second light may have a luminous intensity greater than that of the first light. This is because the phosphor layer 51 converts most of the light into wavelength, so that the luminous intensity of the second light converted through the phosphor layer 51 may be higher than the luminous intensity of the first light. When turned on or not, the surface color of the phosphor layer 51 may be a red color or a color close to red. When turned on or not, the surface color of the phosphor layer 51 may be a color close to that of the phosphor. The phosphor layer 51 may include a material such as silicon or epoxy. The phosphor layer 51 may have a refractive index in the range of 1.45 to 1.6. The phosphor layer 51 may have a refractive index equal to or higher than that of a diffusion agent. The phosphor layer 51 may be higher than the refractive index of the resin layer 41. When the refractive index of the phosphor layer 51 is lower than the above range, the light uniformity is lowered, and when it is higher than the above range, the light transmittance may decrease. Accordingly, the refractive index of the phosphor layer 51 is provided in the above range, so that the light transmittance and the light uniformity may be adjusted. Since the phosphor layer 51 has a phosphor therein, it may be defined as a layer that diffuses light. The content of the phosphor may be added in the same amount as the resin material constituting the phosphor layer 51. The phosphor layer 51 may be mixed in a ratio of a resin material and a phosphor in a ratio of, for example, 4:6 to 6:4. The phosphor may range from 40 wt % to 60 wt % in the phosphor layer 51. The content of the phosphor may have a difference of 20% or less or 10% or less with respect to the resin material of the phosphor layer 51.

In the embodiment, by adding the phosphor content in the phosphor layer 51 at a ratio of 40% or more or 60% or less, the color on the surface of the phosphor layer 51 may be provided as the color of the phosphor and the diffusion and wavelength conversion efficiency may be improved. In addition, transmission of the wavelength of light, for example, blue light emitted from the light emitting device 21 through the phosphor layer 51 may be reduced. In addition, the light extracted through the phosphor layer 51 may be provided as a surface light source according to the wavelength of the phosphor.

The phosphor layer 51 may be provided in the form of a film by, for example, adding a phosphor in a silicone material and then curing it. The phosphor layer 51 may be formed directly on the resin layer 41 or may be separately formed and then adhered. The phosphor layer 51 manufactured in the form of a film may be adhered to the upper surface of the resin layer 41. An adhesive may be disposed between the phosphor layer 51 and the resin layer 41. The adhesive is a transparent material, and may be an adhesive such as UV adhesive, silicone or epoxy. Since the phosphor layer 51 is provided in the form of a film, it is possible to provide a uniform distribution of the phosphor inside, and the color sense of the surface color may be provided at a certain level or higher. By using a film made of a resin material for the phosphor layer 51, a module having high ductility may be provided as compared to the case of using a polyester (PET) film. The phosphor layer 51 may be a protective film having a phosphor or a release film having a phosphor. The phosphor layer 51 may be provided as a film attachable or detachable from the resin layer 41.

The phosphor layer 51 may have a thickness t3 (t3<t2) smaller than the thickness t2 of the resin layer 41. The phosphor layer 51 may have a thickness of 0.5 mm or less, for example, in the range of 0.3 mm to 0.5 mm. The thickness t3 of the phosphor layer 51 may be 25% or less of the thickness t2 of the resin layer 41. The thickness t3 of the phosphor layer 51 may be 18% or less, for example, in the range of 14% to 18% of the thickness t2 of the resin layer 41. When the thickness t3 of the phosphor layer 51 is thicker than the above range, the light extraction efficiency may decrease or the module thickness may increase. When it is smaller than the above range, it is difficult to suppress hot spots or the wavelength conversion efficiency may decrease. In addition, the phosphor layer 51 is a layer for wavelength conversion and external protection, and when it is thicker than the above range, the ductility characteristics of the module may be deteriorated, and the degree of design freedom may be lowered.

The phosphor converts the light emitted from the light emitting device 21 to wavelength. When the phosphor is a red phosphor, it is converted into red light. In order to convert most of the light emitted from the light emitting device 21 into wavelength, light is uniformly diffused through a diffusing agent added to the resin layer 41, and the light diffused by the phosphor may be converted to wavelength.

Since the phosphor layer 51 includes a phosphor, an exterior color may be shown as the color of the phosphor. For example, when the phosphor is red, the surface color may be seen as red, so when the light emitting device 21 is turned off, a red image may be provided, and when the light emitting device 21 is turned on, a red light having a predetermined luminous intensity may be diffused and provided a red image of a surface light source. The lighting module 100 according to the embodiment may have a thickness of 5.5 mm or less, emit a surface light source through an upper surface, and may have flexible characteristics. The lighting module 100 may emit light through a side surface.

According to an exemplary embodiment of the invention, light emitted from the light emitting device 21 is diffused by the lens portion 31 of the resin layer 41, so that the pitch between the light emitting devices 21 may be increased. The pitch or interval a1 between the light emitting devices 21 may be 8 mm or more. According to an exemplary embodiment of the invention, since the lens portion 31 of the resin layer 41 is disposed on the light emitting device 21, hot spots may be prevented. According to an exemplary embodiment of the invention, since the phosphor layer 51 is disposed on the resin layer 41 having the lens portion 31, uniform luminance distribution may be provided.

Referring to FIG. 3, the length c of the resin layer 41 in the first direction may be at least 8 times, for example, in a range of 8 times to 10 times the length L1 in the first direction of the light emitting device 21. When the lens portion 31 has a circular bottom shape, the length c in the first direction and the second direction is at least 8 times, for example, in a range of 8 times to 10 times the length L1 in the first direction and the second direction of the light emitting device 21. Since the bottom area of the lens portion 31 is arranged to be 20 times or more larger than the bottom area of the light emitting device 21, the diffusion efficiency of light by the lens portion 31 may be improved. Here, the bottom length of the lens portion 31 may be the bottom length of the recess portion R1. Here, the length L1 of one side of the light emitting device 21 may be 50 micrometers or more, for example, in a range of 50 to 1000 micrometers.

The height b, that is, the maximum height or the maximum thickness of the lens portion 31 may be 0.9 times or less, for example, 0.8 times to 0.9 times the thickness t2 of the resin layer 41. Since the height b of the lens portion 31 is arranged in the above range, light may be diffused within the recess portion R1 that is a lower space of the lens portion 31 and distributed in a uniform light distribution through the lens portion 31. In addition, by making the thickness or height b of the lens portion 31 smaller than the thickness t2 of the resin layer 41, the rigidity of the resin layer 41 may be prevented form deteriorating and hot spots may be suppressed. Here, the height or thickness of the lens portion 31 may be the height or thickness of the recess portion R1.

The height of the high point of the first incident surface 32 in the lens portion 31 may be 4 times or less, for example, in a range of 3 to 4 times higher than the height b1 of the second incident surface 34. The distance d between the first incident surface 32 and the upper surface of the resin layer 41 is 0.2 times or less, for example, in a range of 0.1 to 0.2 times the thickness t2 of the resin layer 41 from the upper surface of the resin layer 41.

The distance d1 from the upper surface of the resin layer 41 to the lower end of the protrusion portion 33 may be less than the thickness t2 of the resin layer 41 and may be more than twice as large as the distance d from the upper surface of the resin layer 41 to the high point of the first incidence surface 32. Accordingly, the curvature of the curved surface of the first incidence surface 32 may be changed according to the depth of the lower end of the protrusion portion 33, thereby increasing light reflection efficiency.

The protrusion portion 33 may be disposed closer to the lower surface than the upper surface of the resin layer 41. The lower depth d1 of the protrusion portion 33 is a distance from the upper surface of the resin layer 41 to the lower end of the protrusion portion 33, and may be 50% or more, for example, in a range of 50% to 70% the thickness t2 of the resin layer 41. By forming the protrusion portion 33 in the above range in the direction of the light emitting device 21 in the lens portion 31, the light incident from the light emitting device 21 may be reflected to the first and second incident surfaces 32 and 34.

At the lower end of the resin layer 41, the distance between the lower surface of the resin layer 41 or the upper surface of the substrate 11 may be 50% or less, for example, in a range of 30% to 50% the thickness t2 of the resin layer 41. A distance between the lower end of the resin layer 41 and the substrate 11 may be greater than the height b1 of the second incident surface 34.

The depth d1 of the protrusion portion 33 may be disposed deeper than the height of the high point b1 (d1>b1) of the first incident surface 32 with respect to the upper surface of the resin layer 41, and may protrude deeply in a range of 2.5 times or more, for example, 2.5 times to 3.5 times the high point of the first incident surface 32. Accordingly, the light reflection efficiency of the protrusion portion 33 may be improved, and the amount of light incident light from the first incident surface 32 may be increased.

The sum (d1+b1) of the bottom depth d1 of the protrusion portion 33 of the lens portion 31 and the height b1 of the second incident surface 34 may be smaller than the thickness t2 of the resin layer 41. That is, the upper end of the second incidence surface 34 may be disposed lower than the lower end of the protrusion portion 33.

In an embodiment of the invention, the upper and lower surfaces of the resin layer 41 are provided as flat surfaces, and the lens portion 31 is provided to be convex from the flat lower surface, and the light emitting device 21 is sealed with air by forming a recess portion R1 provided under the lens portion 31. Since the lens portion 31 has a hyperbolic shape in the resin layer 41 and is disposed on the light emitting device 21, the diffusion efficiency of light emitted from the light emitting device 21 may be improved. In addition, the width or length of the lens portion 31 is greater than the height or thickness of the lens portion 31, and the height of the lens portion 31 is provided at least 80% of the thickness of the resin layer 41, so that the light diffused within the lens portion 31 may be reflected from each incident surface of the lens portion 31 or may be refracted laterally.

Figure 12:
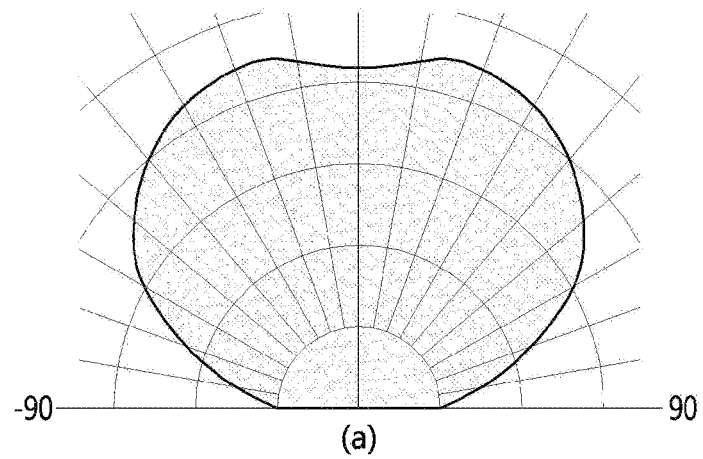
Figure 12:
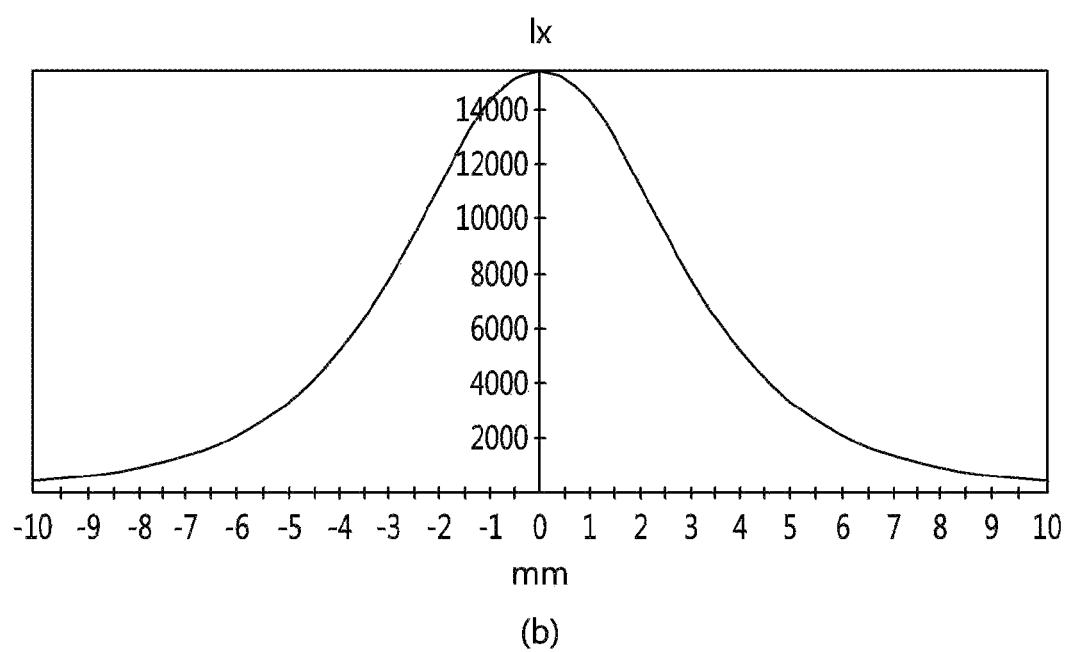

As shown in (a)(b) of FIG. 12 are comparative examples, and when the light emitting device is disposed in the resin layer without the lens portion, in the examples of the angle of beam spread, luminance distribution, and luminous intensity graph, it may be seen that the angel of beam spread of light emitted from the light emitting device in narrow, the hot spot is concentrated and the luminous intensity distribution is narrow. In an embodiment of the invention, referring to (a) (b) of FIG. 13, the angle of beam spread of the light emitting device 21 disclosed in FIG. 2 may be 125 degrees or more, the luminance distribution is widely distributed to suppress hot spots, and the luminous intensity distribution appears widely starting from the light emitting device 21.

As shown in FIG. 14, when comparing the intensity of the light emitting device 21 of the comparative example and the embodiment, it was found that the light intensity of the light emitting device 21 of the embodiment may be reduced by 50% or more and diffused in the lateral direction based on the light intensity of the comparative example.

In the embodiment of the invention, since the lens portion 31 is disposed on each light emitting device 21 in the resin layer 41 in the lighting module, there is an effect of reducing the number of devices mounting by increasing the pitch between the light emitting devices 21 in the lighting module.

Referring to FIG. 4, a lens portion 31 is disposed inside a resin layer 41, a light emitting device 21 is disposed on the bottom of the lens portion 31, and a phosphor layer 51 disposed on an upper portion of the resin layer 41. The phosphor layer 51 covers an upper surface of the resin layer 41 and may not be formed on a side surface of the resin layer 41. In this case, a layer to which a phosphor other than the phosphor added to the phosphor layer 51 is added, may be disposed on the side surface of the resin layer 41. A transmissive material or a reflective layer may be disposed on the side of the resin layer 41. The side surface of the resin layer 41 may be provided as an inclined side surface rather than a vertical side surface.

As shown in FIGS. 15 and 5 to 8, a phosphor concentration Pc of the phosphor layer 51 may have a different distribution according to the luminous intensity of the light emitting device 21 in a region overlapping the light emitting device 21 in a vertical direction. For example, when the luminous intensity of the light emitting device 21 is high, the concentration of the phosphor may be added high (Pc-low), and when the luminous intensity of the light emitting device 21 is low, the concentration of the phosphor is reduced (Pc-low), and when the light intensity of the light emitting device 21 is medium, the concentration of the phosphor may be added in a medium concentration (Pc-mid). Conversely, when the concentration of the phosphor is high, the luminous intensity of the light emitting device 21 may be lowered, and when the concentration of the phosphor is low, the light intensity of the light emitting device 21 may be relatively reduced. Accordingly, the concentration of the phosphor in the corresponding region of the phosphor layer 51 or the light shielding portion may be different for the region overlapping the light emitting device 21 in the vertical direction.

The phosphor concentration of the phosphor layer 51 may have a region having a concentration different from the concentration of phosphor layer 51 or may include a light shielding portion, in an area facing the light emitting device 21 based on the light emitting device 21 or in an area larger than the area of the light emitting device 21 and smaller than the lens portion 31. Here, the light shielding portion may be a region having a phosphor concentration higher or lower than that of the phosphor layer 51.

Figure 5:
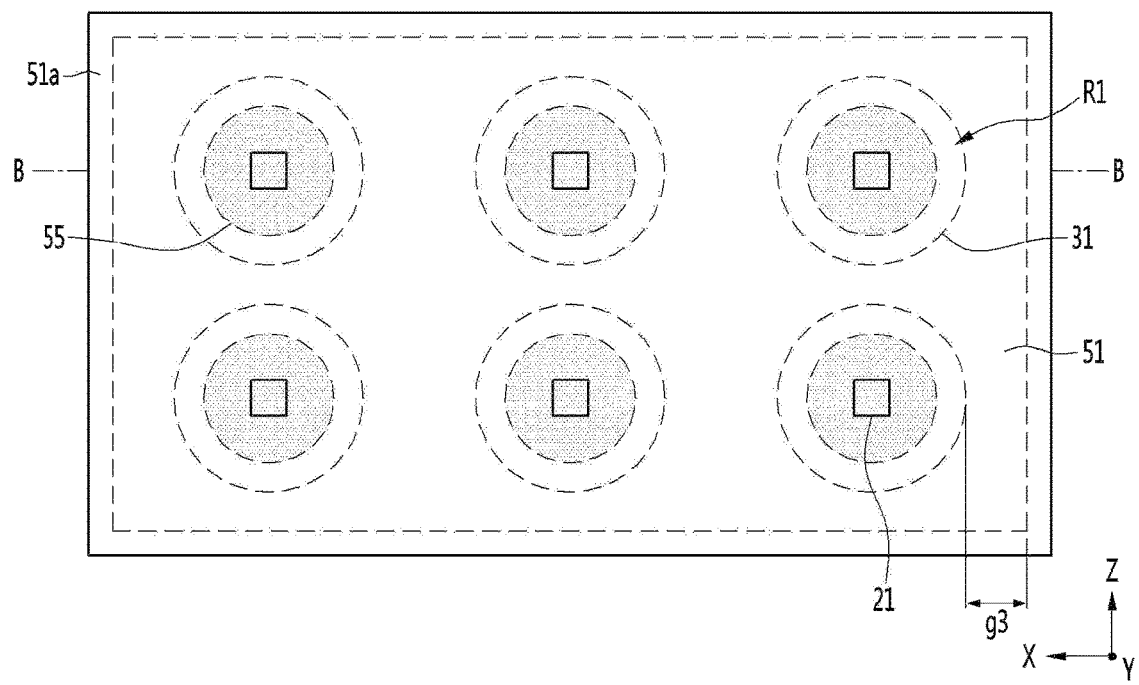
FIG. 5 is a plan view showing a lighting module according to a second embodiment of the invention.
Figure 6:
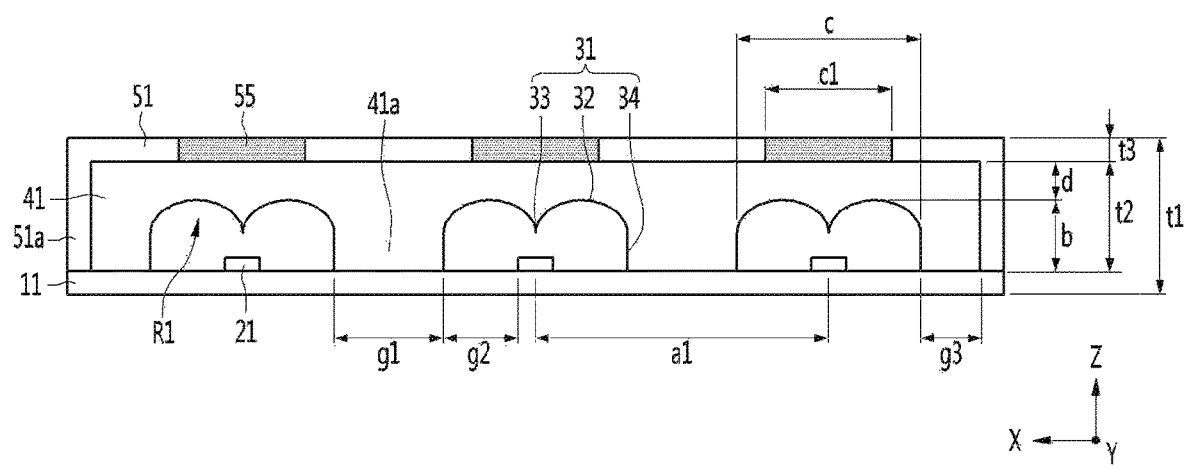
FIG. 6 is a first example of a cross-sectional view on B-B side of the lighting module of FIG. 5.
Figure 7:
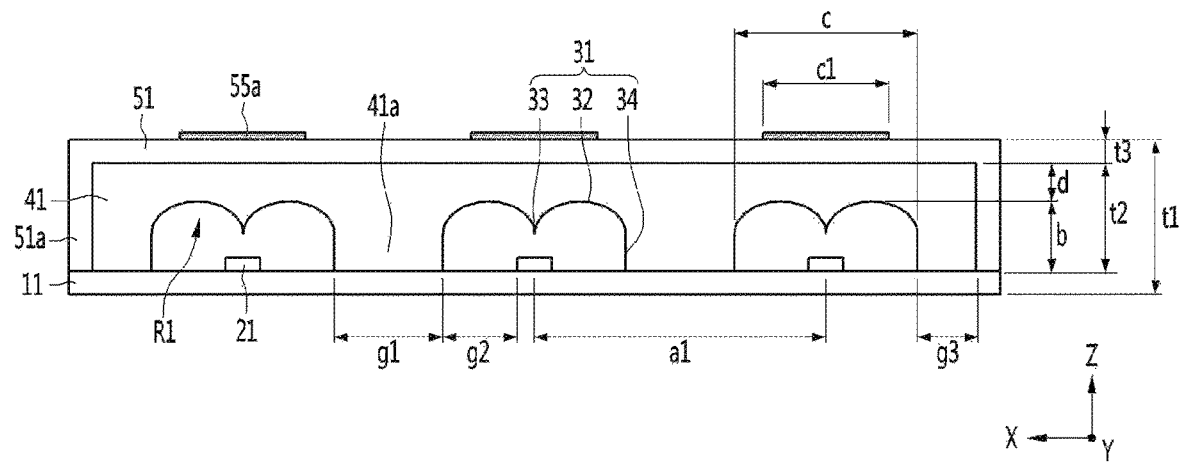
FIG. 7 is a second example of a cross-sectional view on the B-B side of the lighting module of FIG. 5.
Figure 8:
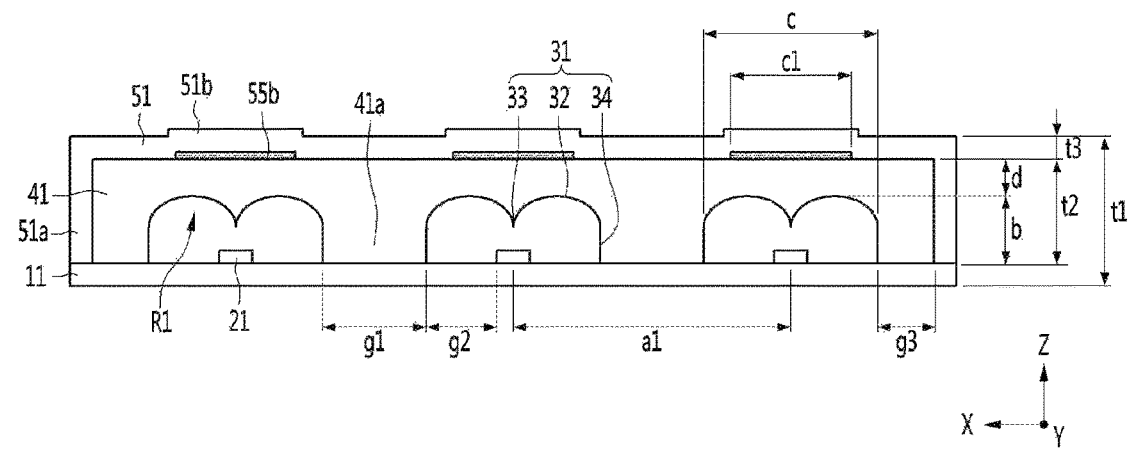
FIG. 8 is a third example of a cross-sectional view on the B-B side of the lighting module of FIG. 5.

FIG. 5 is a plan view showing a lighting module according to a second embodiment of the invention, FIG. 6 is a first example of a cross-sectional view on the B-B side of the lighting module of FIG. 5, and FIG. 7 is a second example of a cross-sectional view of the B-B side of the lighting module of FIG. 5, and FIG. 8 is a third example of a cross-sectional view on the B-B side of the lighting module of FIG. 5. In describing the second embodiment, the same configuration as the first embodiment may be selectively applied to the second embodiment by referring to the description of the first embodiment.

Referring to FIGS. 5 and 6, the lighting module includes a substrate 11, a light emitting device 21 disposed on the substrate 11, and a resin layer 41 disposed on the light emitting device 21 and disposed on the substrate 11, and a phosphor layer 51 on the resin layer 41. The phosphor layer 51 may be disposed on an upper surface of the resin layer 41 or may be disposed on an upper surface and a side surface of the resin layer 41. The phosphor layer 51 may include a light shielding portion 55. The light shielding portion 55 may include a phosphor. The light shielding portion 55 may include a phosphor concentration higher than the phosphor concentration of the phosphor layer 51.

The light shielding portion 55 may be disposed in a region overlapping the light emitting device 21 in a vertical direction. The light shielding portion 55 may be disposed in an area of at least twice the area of the upper surface of the light emitting device 21, for example, in a range of 2 to 10 times. Since the light shielding portion 55 covers the upper region of the light emitting device 21, the intensity of light emitted from the light emitting device 21 may be reduced and hot spots may be suppressed.

The width c1 of the light shielding portion 55 may be one or more times the width of the light emitting device 21, and may be, for example, in a range of 1 to 5 times. The thickness of the light shielding portion 55 may be equal to or thicker than the thickness t3 of the phosphor layer 51. The light shielding portion 55 may be disposed through an open region of the phosphor layer 51 and may contact an upper surface of the resin layer 41. As shown in FIG. 5, the light shielding portion 55 may have a circular top view. The light shielding portion 55 and the lens portion 31 may be formed in a concentric circle shape. The light shielding portion 55 may overlap the first incident surface 32 and the protrusion portion 33 in a vertical direction. Since the light shielding portion 55 is disposed to have a length smaller than the bottom length of the lens portion 31, it is possible to prevent a decrease in the intensity of light extracted through the first incident surface 32. The light shielding portion 55 may have one or more types of phosphors, and may include at least one of red, green, yellow, and blue phosphors. The light shielding portion may include a phosphor and a diffusion agent.

FIG. 7 is a different example from that of FIG. 6, and a light shielding portion 55a may be disposed on the phosphor layer 51. The light shielding portion 55a may be the same as or different from the phosphor of the phosphor layer 51. The phosphor concentration of the light shielding portion 55a may be equal to or higher than the phosphor concentration of the phosphor layer 51. That is, since the phosphor layer 51 and the light shielding portion 55a are stacked in multiple layers, the phosphor concentration in the region vertically overlapped with the light emitting device 21 is disposed higher than in other regions, so the light shielding effect may be improved.

The light shielding portion 55a may overlap the light emitting device 21 in a vertical direction. The light shielding portion may be disposed in an inner region of the lens portion 31 rather than the second incident surface 34. The width c1 of the light shielding portion 55a may be longer than the width of the light emitting device 21 and smaller than the bottom length of the lens portion 31. The light shielding portion 55a may overlap a part of the protrusion portion 33 and the first incident surface 32 of the lens portion 31 in a vertical direction. The light shielding portion 55a may be provided on an upper surface of the phosphor layer 51 to have a thickness thinner than the thickness t3 of the phosphor layer 51. The phosphor added to the light shielding portion 55a may include at least one or two or more of red, green, blue, and yellow. The phosphor of the light shielding portion may include the same phosphor as the phosphor of the phosphor layer 51, for example, a red phosphor. The light shielding portion 55a may include a phosphor and a diffusion agent. The light shielding portion 55a may have a surface color that is deeper than that of the phosphor layer 51. For example, based on the red color, the surface saturation of the light shielding portion may be thicker or higher than the surface saturation of the phosphor layer 51. As shown in FIG. 5, the light shielding portion 55a may have a circular top view. The light shielding portion 55a and the lens portion 31 may be formed in a concentric circle shape.

The lighting module disclosed in FIG. 8 is a third example different from that of FIG. 6. As shown in FIG. 8, the light shielding portion 55b may be disposed on the resin layer 41. The light shielding portion 55b may be disposed between the phosphor layer 51 and the resin layer 41. The light shielding portion 55b may be the same as or different from the phosphor of the phosphor layer 51. The phosphor concentration of the light shielding portion 55b may be equal to or higher than the phosphor concentration of the phosphor layer 51. The light shielding portion 55b may overlap the light emitting device 21 in a vertical direction. The light shielding portion 55b may be disposed in an inner region of the lens portion 31 rather than the second incident surface 34. The width c1 of the light shielding portion 55b may be longer than the width of the light emitting device 21 and may be less than the bottom length of the lens portion 31. The light shielding portion 55b may overlap a part of the protrusion portion 33 and the first incident surface 32 of the lens portion 31 in a vertical direction. The light shielding portion 55b may be provided on the upper surface of the resin layer 41 to have a thickness thinner than the thickness t3 of the phosphor layer 51. The phosphor added to the light shielding portion 55b may include at least one or two or more of red, green, blue, and yellow. The phosphor added to the light shielding portion 55b may include the same phosphor, for example, a red phosphor, as the phosphor of the phosphor layer 51. The light shielding portion 55b may include a phosphor and a diffusion agent.

The light shielding portion 55b may have a surface color that is deeper than that of the phosphor layer 51. For example, based on the red color, the surface saturation of the light shielding portion 55b may be deeper or higher than the surface saturation of the phosphor layer 51. As shown in FIG. 5, the light shielding portion 55b may have a circular top view. The light shielding portion 55b and the lens portion 31 may be formed in a concentric circle shape. In the phosphor layer 51, an upper region 51b overlapping the light shielding portion 55b may protrude above an upper surface of the phosphor layer 51. An upper surface area of the upper region 51b of the phosphor layer 51 overlapping the light shielding portion 55b may be larger than the upper surface area of the light shielding portion 55b. Accordingly, the light shielding portion 55b and the phosphor layer 51 convert the wavelength of incident light to emit light, and the luminous intensity may be lowered in the light shielding area.

In FIG. 9, (a)(b)(c) of FIG. 9 is diagrams illustrating a manufacturing process of the lighting module according to the first embodiment. As shown in (a) (b) of FIG. 9, the light emitting device 21 is mounted on the substrate 11 at a predetermined pitch. When the light emitting device 21 is mounted on the substrate 11, the resin layer 41 having the recess portion R1 and the lens portion 31 is attached on the substrate 11. Here, the substrate 11 and the resin layer 41 may be adhered to each other with an adhesive or an adhesive film. The recess portion R1 and the lens portion 31 of the resin layer 41 may be arranged to correspond to each other according to the pitch of the light emitting device 21. The recess portion R1 and the lens portion 31 may be provided after injection molding of the resin layer 41 in an imprint method. The lens portion 31 may include a protrusion portion 33, a first incident surface 32 and a second incident surface 34, and may be disposed to surround the light emitting device 21. A recess portion R1 may be disposed between the lens portion 31 and the light emitting device 21 and the substrate, and the recess portion R1 may be in an air state or a vacuum state.

As shown in (c) of FIG. 9, a phosphor layer 51 may be formed on the surface of the resin layer 41. The phosphor layer 51 may attach a pre-prepared film form to the surface of the resin layer 41 by a heat-pressing method. As another example, after providing a mold for injection molding on the surface of the resin layer 41, the phosphor layer 51 may be formed. The phosphor layer 51 may be formed on the upper surface of the resin layer 41, or may be formed on the upper surface and side surfaces of the resin layer 41.

FIG. 10 is an example of a side cross-sectional view of a lighting module according to the third embodiment. In describing the third embodiment, the configuration disclosed above may be selectively applied. Referring to FIG. 10, the lighting module includes a plurality of light emitting devices 21 on a substrate, a diffusion layer 35 having a recess portion R1 on the light emitting device, a phosphor layer 65 on the diffusion layer 35, and a resin layer 71 on the phosphor layer 65.

The diffusion layer 35 may include a recess portion R2 surrounding the light emitting device 21, a lens portion 36 on the surface of the recess portion R2, and a support portion 37 connecting the lens portions 36 to each other. The recess portion R2 surrounds the light emitting device 21 and may be an air region or a vacuum region. The recess portion R2 may overlap the light emitting device 21 in a vertical direction, and may be provided in a hemispherical or semi-elliptical shape.

The diffusion layer 35 is spaced apart from the light emitting device 21 and may be disposed on the substrate. The lens portions 36 are disposed in plural so as to correspond to the light emitting devices 21, respectively, and diffuse the light incident from the light emitting devices 21 on the recess portion R2. The lens portion 36 may have a hemispherical shape or a semi-elliptical shape. The lens portion 36 may be provided in a convex lens shape. The lens portion 36 may diffuse or refract incident light. The support part 37 may connect the plurality of lens portions 36 to each other. The support part 37 may be attached or adhered to the substrate 11.

In the diffusion layer 35, the lens portion 36 and the support portion 37 may be connected to each other with the same thickness. The diffusion layer 35 may have a thickness of 0.5 mm or less, for example, in the range of 0.3 to 0.5 mm. A diffusion agent or phosphor may be added to the diffusion layer 35. The diffusion layer 35 is a transparent resin material, and may be a resin material such as UV (Ultraviolet) resin, epoxy, or silicone. A phosphor layer 65 may be formed on the diffusion layer 35. The phosphor layer 65 may include at least one of red, green, blue, and yellow phosphors in a transparent resin material. The phosphor layer 65 may include, for example, a red phosphor. The phosphor layer 65 may be formed on the lens portion 36 and the support portion 37 of the diffusion layer 35 to have a uniform thickness. In the phosphor layer 65, an extension portion 65A extending on the support portion 37 may be disposed. Each of the diffusion layer 35 and the phosphor layer 65 may be formed by an imprint method and then stacked on a substrate. The extended portion 65A of the phosphor layer 65 may be provided as a convex region on the lens portion 36 and a flat region on the support portion 37.

The resin layer 71 may be disposed on the phosphor layer 65. The upper surface of the resin layer 71 is provided as a flat upper surface and may cover the surface of the phosphor layer 65. The resin layer 71 has a region overlapping the lens portion 36 in a vertical direction, and a thickness of the region may be thinner than a thickness of a region overlapping the support portion in a vertical direction. The resin layer 71 may be disposed on side surfaces of the phosphor layer 65 and the diffusion layer 35. As another example, a layer having a diffusing agent or a layer having a phosphor may be further disposed on side surfaces of the resin layer 71, the diffusion layer 35 and the phosphor layer 65.

As shown in FIGS. 1 and 10, according to an embodiment of the invention, the resin layer 51 or the diffusion layer 35 having the lens portions 31 and 36 is in close contact with the substrate 11, thereby providing with an inner space of the lens portion 36 in air or vacuum. With respect to the layer having the lens portion 36, the recess portions R1 and R2 may be provided in a vacuum state by removing air after being in close contact with the substrate 11. Since the layer having the lens portion 36 is spaced apart from the light emitting device and is disposed to have a convex curve or a hyperbolic curve, the incident light may be diffused or refracted. Therefore, by providing the lens portions 31 and 36 inside the lighting module having a thin thickness of 5 mm or less, there is no need to install a separate lens, and uniform light distribution may provide by the light emitting devices 21 having an increased pitch.

In FIG. 11, (a)(b)(c) of FIG. 11 is an example of a process of attaching the diffusion layer 35 and the phosphor layer 65 in the lighting module of FIG. 10. As shown in (a) (b) of FIG. 11, the diffusion layer 35 prepared in advance is attached on the substrate 11. At this time, the lens portion 36 of the diffusion layer 35 is disposed on each light emitting device 21, and the support portion 37 is in close contact with the substrate 11. In this case, the diffusion layer 35 may be in close contact with the substrate 11 or attached thereto, and then air around the diffusion layer 35 may be removed to provide a recess portion R2 in a vacuum state. The diffusion layer 35 may be manufactured by an imprint method. As shown in (c) of FIG. 11, when the diffusion layer 35 is in close contact with the substrate 11, a previously prepared phosphor layer 65 is attached on the diffusion layer 35 or the phosphor layer 65 may be formed on the diffusion layer 35 using an injection molding mold. Thereafter, a resin layer is formed on the phosphor layer 65 to provide a lighting module as shown in FIG. 10.

FIG. 16 is a diagram illustrating an example of a light emitting device of a lighting module according to an embodiment.

Referring to FIG. 16, the light emitting device disclosed in the embodiment includes a light emitting structure 225 and a plurality of electrodes 245 and 247. The light emitting structure 225 may be formed of a compound semiconductor layer of a group II to VI element, for example, a compound semiconductor layer of a group III-V element or a compound semiconductor layer of a group II-VI element. The plurality of electrodes 245 and 247 are selectively connected to the semiconductor layer of the light emitting structure 225 and supply power. The light emitting device may include a light-transmitting substrate 221. The light-transmitting substrate 221 may be disposed on the light emitting structure 225. The light-transmitting substrate 221 may be, for example, a light-transmitting material, an insulating material, or a conductive material. The light-transmitting substrate 221 may be, for example, at least one of sapphire ($Al_2O_3$), SiC, Si, GaAs, GaN, ZnO, Si, GaP, InP, Ge, and $Ga_2O_3$. A plurality of convex portions (not shown) may be formed on at least one or both of the upper surface and the bottom surface of the light-transmitting substrate 221, thereby improving light extraction efficiency. The side cross-sectional shape of each convex portion may include at least one of a hemispherical shape, a semi-elliptic shape, or a polygonal shape. The light-transmitting substrate 221 may be removed, but is not limited thereto.

At least one of a buffer layer (not shown) and a low conductivity semiconductor layer (not shown) may be included between the light-transmitting substrate 221 and the light emitting structure 225. The buffer layer is a layer for reducing a difference in lattice constant between the light-transmitting substrate 221 and the semiconductor layer, and may be selectively formed from compound semiconductors of Group II to Group VI elements. An undoped compound semiconductor layer of Group III-V elements may be further formed under the buffer layer, but the embodiment is not limited thereto.

The light emitting structure 225 may be disposed under the translucent substrate 221. The light emitting structure 225 includes a first conductive type semiconductor layer 222, an active layer 223, and a second conductive type semiconductor layer 224. Another semiconductor layer may be further disposed above and below each of the layers 222, 223, and 224. The first conductive type semiconductor layer 222 is disposed under the light-transmitting substrate 221 and may be implemented as a semiconductor doped with a first conductive type dopant, for example, an n-type semiconductor layer. The second conductive type semiconductor layer 224 is disposed under the active layer 223. The first and/or second conductive type semiconductor layers 222 and 224 include a composition formula of $In_xAl_yGa_{1-x-y}N$ ($0 \le x \le 1$, $0 \le y \le 1$, $0 \le x+y \le 1$). The first or/and second conductive type semiconductor layers 222 and 224 may be selected from compound semiconductors of group III-V elements, for example, GaN, AlN, AlGaN, InGaN, InN, InAlGaN, AlInN, AlGaAs, GaP, GaAs, GaAsP, and AlGaInP. The first conductive type dopant is an n-type dopant and includes a dopant such as Si, Ge, Sn, Se, and Te. The second conductive type semiconductor layer 224 is a p-type semiconductor layer, and the first conductive type dopant is a p-type dopant, and may include Mg, Zn, Ca, Sr, and Ba. The active layer 223 is disposed under the first conductive type semiconductor layer 222 and selectively includes a single quantum well, a multiple quantum well (MQW), a quantum wire structure, or a quantum dot structure, and may include a cycle of the well layer and the barrier layer. The cycle of the well layer/barrier layer includes, for example, at least one of a pair of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and In P/GaAs.

As another example of the light emitting structure 225, the first conductive type semiconductor layer 222 may be implemented as a p-type semiconductor layer, and the second conductive type semiconductor layer 224 may be implemented as an n-type semiconductor layer. A third conductive type semiconductor layer having a polarity opposite to that of the second conductive type may be formed under the second conductive type semiconductor layer 224. In addition, the light emitting structure 225 may be implemented in any one of an n-p junction structure, a p-n junction structure, an n-p-n junction structure, and a p-n-p junction structure.

First and second electrodes 245 and 247 are disposed under the light emitting structure 225. The first electrode 245 is electrically connected to the first conductive semiconductor layer 222, and the second electrode 247 is electrically connected to the second conductive semiconductor layer 224. The first and second electrodes 245 and 247 may have a polygonal or circular bottom shape. A plurality of recess portions 226 may be provided in the light emitting structure 225. The light emitting device includes first and second electrode layers 241 and 242, third electrode layers 243, and insulating layers 231 and 233. Each of the first and second electrode layers 241 and 242 may be formed as a single layer or multiple layers, and may function as a current diffusion layer. The first and second electrode layers 241 and 242 may include a first electrode layer 241 disposed under the light emitting structure 225, and a second electrode layer 242 disposed under the first electrode layer 241. The first electrode layer 241 diffuses current, and the second electrode layer 241 reflects incident light.

The first and second electrode layers 241 and 242 may be formed of different materials. The first electrode layer 241 may be formed of a translucent material, for example, a metal oxide or a metal nitride. The first electrode layer 241 may be selectively formed from, for example, indium tin oxide (ITO), ITO nitride (ITON), indium zinc oxide (IZO), IZO nitride (IZON), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), and GZO (gallium zinc oxide). The second electrode layer 242 is in contact with a lower surface of the first electrode layer 241 and may function as a reflective electrode layer. The second electrode layer 242 includes a metal such as Ag, Au, or Al. The second electrode layer 242 may partially contact the lower surface of the light emitting structure 225 when a portion of the first electrode layer 241 is removed.

As another example, the structures of the first and second electrode layers 241 and 242 may be stacked in an omni-directional reflector layer (ODR) structure. The omni-directional reflective structure may be formed in a stacked structure of a first electrode layer 241 having a low refractive index and a second electrode layer 242 made of a highly reflective metal material in contact with the first electrode layer 241. The electrode layers 241 and 242 may have, for example, a stacked structure of ITO/Ag. The omni-directional reflection angle at the interface between the first electrode layer 241 and the second electrode layer 242 may be improved.

As another example, the second electrode layer 242 may be removed, and may be formed of a reflective layer of a different material. The reflective layer may be formed in a distributed Bragg reflector (DBR) structure, and the distributed Bragg reflector structure includes a structure in which two dielectric layers having different refractive indices are alternately disposed, and may include, for example, any one different from a $SiO_2$ layer, a $Si_3N_4$ layer, a $TiO_2$ layer, an $Al_2O_3$ layer, and an MgO layer. As another example, the electrode layers 241 and 242 may include both a distributed Bragg reflective structure and an omni-directional reflective structure, and in this case, a light emitting device having a light reflectance of 98% or more may be provided. Since the light emitting device mounted in the flip method emits light reflected from the second electrode layer 242 through the light-transmitting substrate 221, most of the light may be emitted toward a vertical direction. The light emitted to the side of the light emitting device may be reflected by the reflective member to the light exit area through the adhesive member according to the embodiment.

The third electrode layer 243 is disposed under the second electrode layer 242 and is electrically insulated from the first and second electrode layers 241 and 242. The third electrode layer 243 is formed of a metal such as titanium (Ti), copper (Cu), nickel (Ni), gold (Au), chromium (Cr), tantalum (Ta), platinum (Pt), tin (Sn), silver (Ag), and phosphorus (P). A first electrode 245 and a second electrode 247 are disposed under the third electrode layer 243.

The insulating layers 231 and 233 block unnecessary contact between the first and second electrode layers 241 and 242, the third electrode layer 243, the first and second electrodes 245 and 247, and the layers of the light emitting structure 225. In the insulating layers 231 and 233, the first insulating layer 231 is disposed between the third electrode layer 243 and the second electrode layer 242, and the second insulating layer 233 is disposed between the third electrode layer 243 and the first and second electrodes 245 and 247.

The third electrode layer 243 is connected to the first conductive type semiconductor layer 222. The connection part 244 of the third electrode layer 243 protrudes in a via structure through the lower portions of the first and second electrode layers 241 and 242 and the light emitting structure 225 and contacts the first conductive type semiconductor layer 222. The connection part 244 may be disposed in plurality. A portion 232 of the first insulating layer 231 extends along the recess 226 of the light emitting structure 225 and disposed around the connection part 244 of the third electrode layer 243, and blocks the electrically connection between the third electrode layer 243 and the first and second electrode layers 241 and 242, and between the second conductive semiconductor layer 224 and the active layer 223. An insulating layer may be disposed on the side of the light emitting structure 225 to protect the side thereof, but the embodiment is not limited thereto. The second electrode 247 is disposed under the second insulating layer 233, and contacts or is connected to at least one of the first and second electrode layers 241 and 242 through the open region of the second insulating layer 233. The first electrode 245 is disposed under the second insulating layer 233 and is connected to the third electrode layer 243 through an open region of the second insulating layer 233. Accordingly, the protrusion portion 248 of the second electrode 247 is electrically connected to the second conductive type semiconductor layer 224 through the first and second electrode layers 241 and 242, and the protrusion portion 246 of the first electrode 245 is electrically connected to the first conductive type semiconductor layer 222 through the third electrode layer 243.

FIG. 17 is a plan view of a vehicle to which a vehicle lamp to which a lighting module is applied according to an embodiment is applied, and FIG. 18 is a view showing a vehicle lamp having a lighting module or a lighting device disclosed in the embodiment. Referring to FIGS. 17 and 18, in the vehicle 900, the tail lamp 800 may include a first lamp unit 812, a second lamp unit 814, a third lamp unit 816, and a housing 810. Here, the first lamp unit 812 may be a light source for the role of a direction indicator, the second lamp unit 814 may be a light source for the role of a vehicle width lamp, and the third lamp unit 816 serves as a light source for brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. At this time, the housing 810 may have a curvature according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, and the like described in the above embodiments are included in at least one embodiment of the invention, and are not necessarily limited to only one embodiment. Further, the features, structures, effects, etc. illustrated in each embodiment may be implemented by combining or modifying other embodiments by a person having ordinary knowledge in the field to which the embodiments belong. Accordingly, contents related to such combinations and modifications should be interpreted as being included in the scope of the invention.

In addition, although the embodiments have been described above, these are only examples and do not limit the invention, and those of ordinary skill in the field to which the invention belongs are illustrated above within the scope not departing from the essential characteristics of the present embodiment. It will be seen that various modifications and applications that are not available are possible. For example, each component specifically shown in the embodiment may be modified and implemented. And differences related to these modifications and applications should be construed as being included in the scope of the invention defined in the appended claims.

What is claimed is:

1. A lighting module comprising:
a substrate;
a plurality of light emitting devices disposed on the substrate;
a resin layer disposed on the substrate and the plurality of light emitting devices and including a plurality of lens portions; and
a plurality of recess portions sealing a periphery of each of the light emitting devices and forming a space separating each of the lens portions and the substrate,
wherein the resin layer includes a flat upper surface and a lower surface disposed on the substrate,
wherein each of the lens portions includes a protrusion portion protruding toward a center portion of each of the light emitting devices, a first incident surface having a convex curved surface around each of the protrusion portions, and a second incident surface extending perpendicular to the substrate from a lower portion of the first incident surface,
wherein a distance from the upper surface of the resin layer to a lower end of the protrusion portion is smaller than a thickness of the resin layer, and is more than twice a distance from the upper surface of the resin layer to a high point of the first incident surface,
wherein a refractive index of the recess portion is 1.2 or less,
wherein the resin layer is formed of a resin material without a phosphor and a diffusion agent therein, and
wherein the resin layer is not in contact with the plurality of emitting devices.

2. The lighting module of claim 1, wherein a distance between the protrusion portion of each of the lens portions and the substrate is greater than a height of the second incident surface.

3. The lighting module of claim 2, wherein a maximum height of each of the lens portions is in a range of 80% to 90% of a vertical distance from the lower surface of the resin layer to the upper surface of the resin layer.

4. The lighting module of claim 2, comprising a phosphor layer disposed on the upper surface of the resin layer, and
wherein a content of a phosphor added in the phosphor layer is 40% or more.

5. The lighting module of claim 4, wherein a side portion of the phosphor layer extends on an entire side surface of the resin layer and contacts the substrate, and
wherein a distance from a lower surface of the substrate to an upper surface of the phosphor layer is 5.5 mm or less.

6. The lighting module of claim 4, wherein the phosphor layer comprises a light shielding portion overlapping in a direction perpendicular to the protrusion portion of each of the lens portions and the substrate, and
wherein the light shielding portion is disposed on an inner region of one of the lens portions.

7. The lighting module of claim 1, wherein a bottom width of each of the recess portions parallel to the substrate is greater than a thickness of the resin layer perpendicular to the substrate, and
wherein the light module comprises a light shielding portion disposed on the resin layer and overlapping in a direction perpendicular to the protrusion portion.

8. A lighting module comprising:
a substrate;
a plurality of light emitting devices disposed on the substrate;
a resin layer disposed on the substrate and the plurality of light emitting devices;
a phosphor layer on the resin layer; and
a plurality of recess portions disposed on and around each of the light emitting devices,
wherein the resin layer is disposed on an upper portion and a side portion of the recess portions, respectively,
wherein the resin layer forming the recess portions includes a protrusion portion protruding toward the light emitting device, a first incidence surface having a curved surface convex in opposite directions relative to the protrusion portion, and a second incidence surface extending in a direction of the substrate from an end portion of the first incidence surface,
wherein a shortest distance from an upper surface of the resin layer to a low point of the protrusion portion is less than a thickness of the resin layer, and is more than twice a distance from the upper surface of the resin layer to a high point of the first incident surface, wherein a bottom width of each of the recess portions is greater than the thickness of the resin layer, wherein a refractive index of the recess portion is smaller than a refractive index of the resin layer, wherein the resin layer is formed of a resin material without a phosphor and a diffusion agent therein, wherein the resin layer is not in contact with the plurality of emitting devices, and wherein a distance from a lower surface of the substrate to an upper surface of the phosphor layer is 5.5 mm or less.

9. The lighting module of claim 8, wherein a distance between the plurality of recess portions is smaller than a maximum width of the recess portions.

10. The lighting module of claim 8, wherein the substrate is a flexible circuit board, wherein the recess portion includes air, wherein the resin layer is formed of a transparent silicon material, and wherein a content of a phosphor added in the phosphor layer is 20% or less from a content of a resin material of the phosphor layer.

11. The lighting module of claim 8, comprising a light shielding portion overlapping in a direction perpendicular to each of the plurality of light emitting devices and disposed on an upper or lower surface of the phosphor layer, wherein a side cross-section of the first incidence surface has a hyperbolic shape in a direction opposite to each other based on the protrusion portion, wherein the upper surface and a side surface of the phosphor layer are spaced apart from the recess portions.

12. The lighting module of claim 8, comprising a light shielding portion overlapping each of the plurality of light emitting devices in a direction perpendicular to the upper surface of the resin layer, and wherein the light shielding portion disposed on the upper surface of the resin layer is disposed to an inner region more than a region of the second incident surface in a vertical direction.

13. The lighting module of claim 12, wherein a width of the light shielding portion is smaller than the bottom width of each of the recess portions.

14. The lighting module of claim 8, wherein the resin layer includes a plurality of lens portions, the protrusion portion, the first incident surface and the second incident surface, and wherein an interval between the lens portions is greater than an interval between each of the lens portions and a side surface of the resin layer.

15. The lighting module of claim 11, wherein the light shielding portion is disposed between the phosphor layer and the resin layer, and is overlapped with the plurality of light emitting devices and the protrusion portion.

16. The lighting module of claim 15, wherein the light shielding portion and the recess portion are formed in a concentric circle shape.

17. The lighting module of claim 11, wherein the light shielding portion has a phosphor and a diffusion agent therein.

18. The lighting module comprising, a substrate;

a plurality of light emitting devices disposed on the substrate;

a resin layer disposed on the substrate and the plurality of light emitting devices;

a phosphor layer disposed on upper and side surfaces of the resin layer; and a plurality of light shielding portions overlapping each of the plurality of light emitting devices in a vertical direction and disposed on the resin layer, wherein the resin layer includes a plurality of recess portions disposed on and around each of the light emitting devices, wherein the resin layer is disposed on an upper portion and side portion of the recess portions, respectively, wherein the resin layer includes a plurality of protrusion portions protruding toward the light emitting device, and a first incidence surface having a curved surface around each protrusion portion, and a second incident surface extending in a direction of the substrate from an outer end of the first incident surface, wherein a shortest distance from the upper surface of the resin layer to a lower point of each protrusion portion is smaller than a thickness of the resin layer, and is more than twice a distance from the upper surface of the resin layer to a high point of the first incident surface, wherein a bottom width of each of the recess portions is greater than the thickness of the resin layer, wherein a refractive index of each of the recess portions is less than a refractive index of the resin layer, wherein the resin layer is not in contact with the plurality of light emitting devices, wherein each of the light shielding portions overlaps each protrusion portion and the first incidence surface in a vertical direction, and is disposed on an inner region of each of the recess portions, and wherein a distance from a lower surface of the substrate to an upper surface of the phosphor layer is 5.5 mm or less.

19. The lighting module of claim 18, wherein the resin layer is formed of a resin material without a phosphor and a diffusion agent therein.

20. The lighting module of claim 18, wherein the phosphor layer is disposed on an entire upper surface and side surfaces of the resin layer, respectively, and wherein a content of a phosphor added in the phosphor layer is 20% or less from a content of a resin material of the phosphor layer.

* * * * *